(12) United States Patent
Tabata

(10) Patent No.: US 11,538,802 B2
(45) Date of Patent: Dec. 27, 2022

(54) SEMICONDUCTOR DEVICE INCLUDING A SWITCHING ELEMENT IN A FIRST ELEMENT REGION AND A DIODE ELEMENT IN A SECOND ELEMENT REGION

(71) Applicant: Mitsubishi Electric Corporation, Tokyo (JP)

(72) Inventor: Mituharu Tabata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 100 days.

(21) Appl. No.: 16/847,566

(22) Filed: Apr. 13, 2020

(65) Prior Publication Data
US 2020/0388613 A1  Dec. 10, 2020

(30) Foreign Application Priority Data
Jun. 7, 2019  (JP) .............................. JP2019-107156

(51) Int. Cl.
*H01L 27/06* (2006.01)
*H01L 29/06* (2006.01)
(Continued)

(52) U.S. Cl.
CPC .......... *H01L 27/0664* (2013.01); *H01L 24/48* (2013.01); *H01L 25/072* (2013.01);
(Continued)

(58) Field of Classification Search
CPC ............. H01L 27/0617; H01L 27/0664; H01L 27/0635; H01L 27/0629; H01L 27/0647; H01L 27/0652; H01L 27/0727; H01L 29/0623; H01L 29/7397; H01L 29/868; H01L 24/05; H01L 24/06; H01L 24/48; H01L 24/49; H01L 2924/13055;
(Continued)

(56) References Cited

U.S. PATENT DOCUMENTS 8,609,502 B1 * 12/2013 Koyama ........... H01L 29/66325
257/370
10,290,711 B2 * 5/2019 Nakamura .......... H01L 29/7397
(Continued)

FOREIGN PATENT DOCUMENTS

JP  2002-314082 A  10/2002
JP  2009-267394 A  11/2009
(Continued)

OTHER PUBLICATIONS

An Office Action; "Notice of Reasons for Refusal," mailed by the Japanese Patent Office dated May 31, 2022, which corresponds to Japanese Patent Application No. 2019-107156 and is related to U.S. Appl. No. 16/847,566, with English language translation.

*Primary Examiner* — Khiem D Nguyen
(74) *Attorney, Agent, or Firm* — Studebaker & Brackett PC

(57) ABSTRACT

In a RC-IGBT chip, an anode electrode film and an emitter electrode film are arranged with a distance therebetween. The anode electrode film and the emitter electrode film are electrically connected by a wiring conductor having an external impedance and an external impedance. The external impedance and the external impedance include the resistance of the wiring conductor and the inductance of the wiring conductor.

18 Claims, 20 Drawing Sheets

(51) Int. Cl.
*H01L 29/739* (2006.01)
*H01L 29/868* (2006.01)
*H01L 25/07* (2006.01)
*H01L 23/00* (2006.01)

(52) U.S. Cl.
CPC ...... *H01L 29/0623* (2013.01); *H01L 29/7397* (2013.01); *H01L 29/868* (2013.01); *H01L 2224/48139* (2013.01); *H01L 2924/12031* (2013.01); *H01L 2924/13055* (2013.01); *H01L 2924/3011* (2013.01)

(58) Field of Classification Search
CPC ..... H01L 2224/484; H01L 2224/48139; H01L 25/072
USPC .......................................................... 257/140
See application file for complete search history.

(56) References Cited

U.S. PATENT DOCUMENTS

| | | | |
|---|---|---|---|
| 10,672,761 B2 * | 6/2020 | Yoshida | H01L 29/1095 |
| 10,707,860 B1 * | 7/2020 | Miyahara | H03K 17/603 |
| 10,771,053 B2 * | 9/2020 | Eguchi | H03K 17/567 |
| 2002/0153586 A1 | 10/2002 | Majumdar et al. | |
| 2007/0194346 A1 * | 8/2007 | Nagase | H01L 29/861 |
| | | | 257/E29.198 |
| 2009/0242931 A1 * | 10/2009 | Tsuzuki | H01L 29/167 |
| | | | 257/143 |
| 2012/0025794 A1 | 2/2012 | Inoue et al. | |
| 2014/0084337 A1 | 3/2014 | Matsudai et al. | |
| 2017/0162562 A1 * | 6/2017 | Haruguchi | H01L 29/7395 |
| 2017/0263603 A1 | 9/2017 | Hata et al. | |
| 2018/0096991 A1 | 4/2018 | Nasu et al. | |
| 2019/0287964 A1 | 9/2019 | Yamano et al. | |

FOREIGN PATENT DOCUMENTS

| | | | | |
|---|---|---|---|---|
| JP | 4413482 B2 * | 2/2010 | | H01L 27/04 |
| JP | 2010-135646 A | 6/2010 | | |
| JP | 2011-082220 A | 4/2011 | | |
| JP | 2011-210800 A | 10/2011 | | |
| JP | 2012-050065 A | 3/2012 | | |
| JP | 2014-103376 A | 6/2014 | | |
| JP | 2016-072359 A | 5/2016 | | |
| JP | 2018-061009 A | 4/2018 | | |
| WO | 2018/225571 A1 | 12/2018 | | |

* cited by examiner

FIG.2
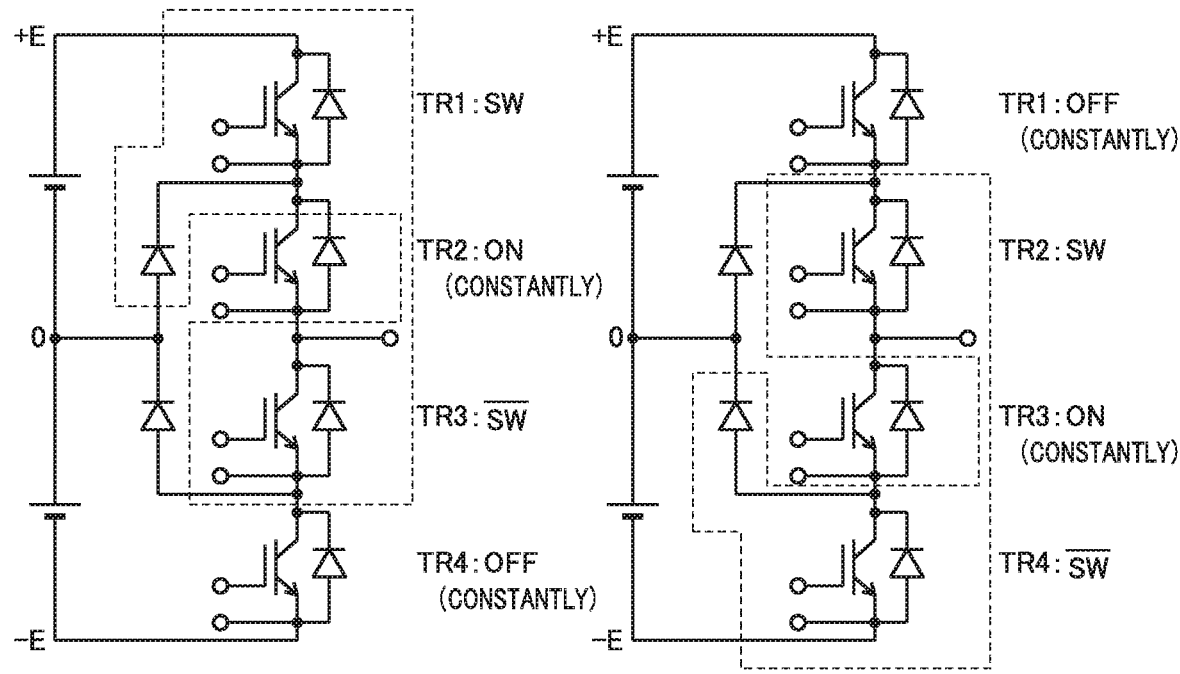
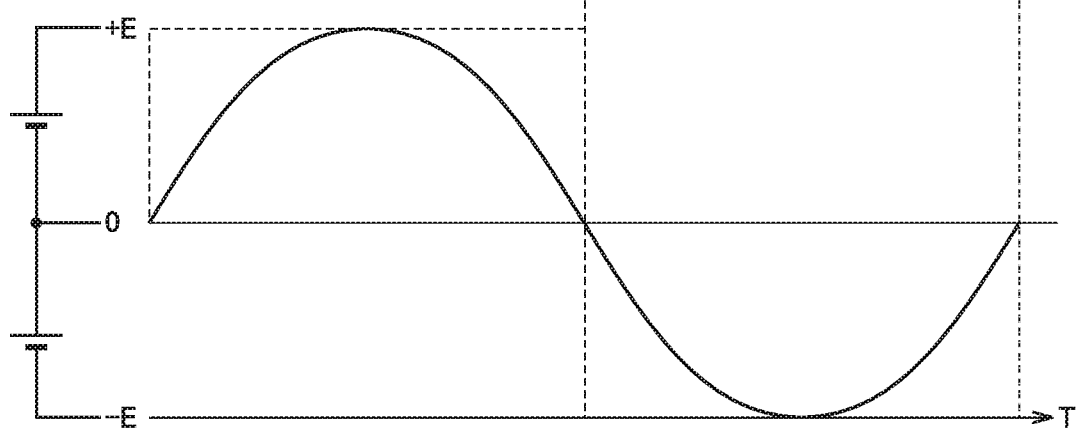

FIG.3

| POTENTIAL SELECTION | H/B POTENTIAL | DIRECTION OF OUTPUT CURRENT | |
|---|---|---|---|
| | | POWER RUNNING (YP) | REGENERATION (YR) |
| UPPER POTENTIAL | High (+E) | STATE C1 | STATE C2 |
| | Low (0) | STATE C3 | STATE C4 |

FIG.4

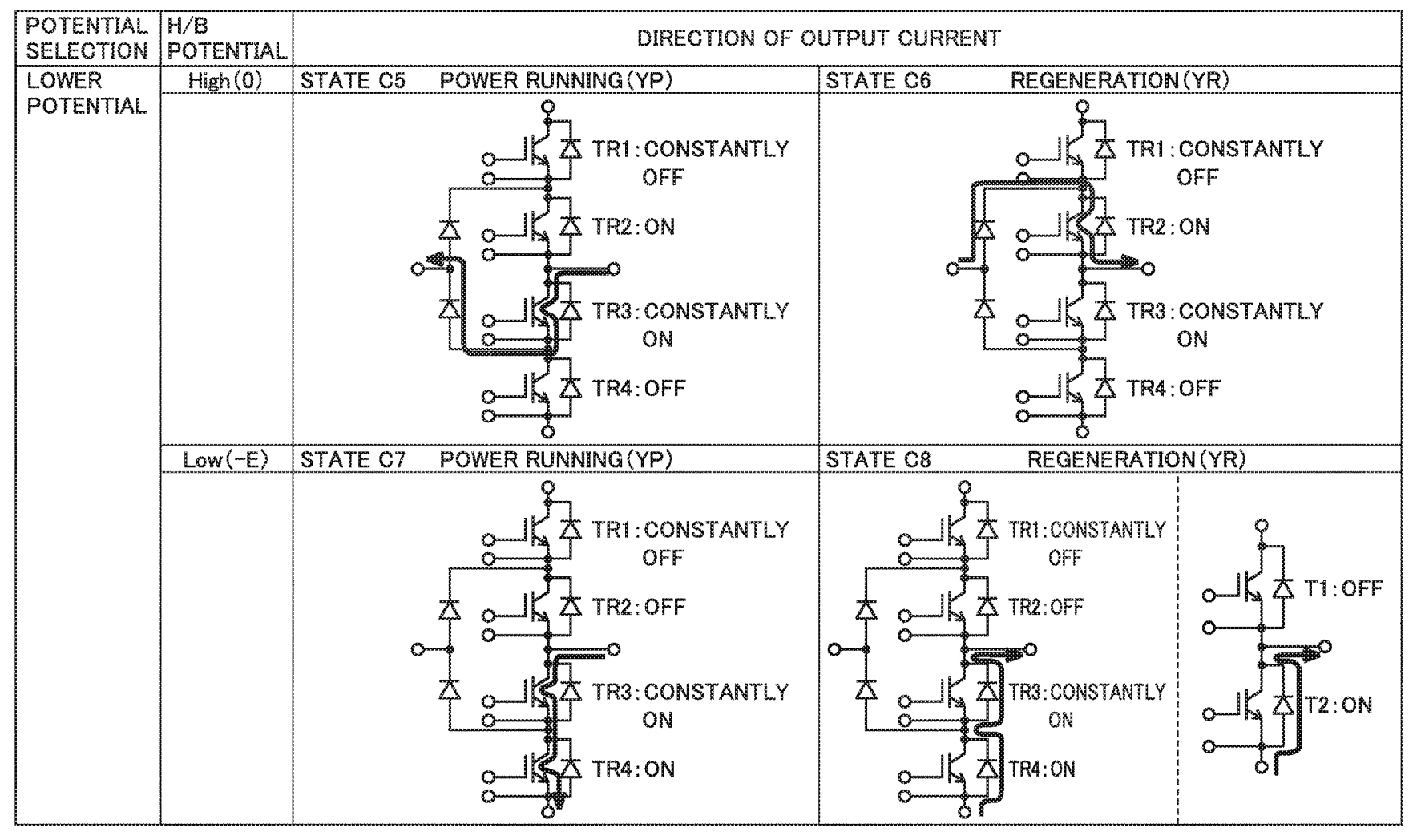

| POTENTIAL SELECTION | H/B POTENTIAL | DIRECTION OF OUTPUT CURRENT | |
|---|---|---|---|
| | | POWER RUNNING (YP) | REGENERATION (YR) |
| LOWER POTENTIAL | High (0) | STATE C5 | STATE C6 |
| | Low (−E) | STATE C7 | STATE C8 |

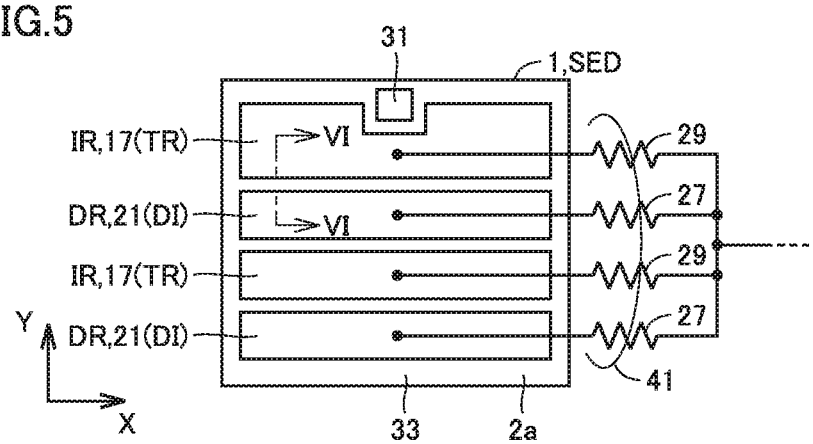
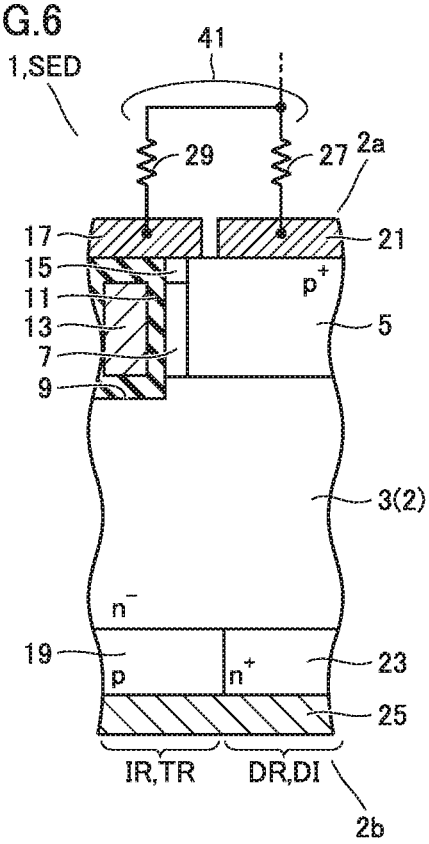

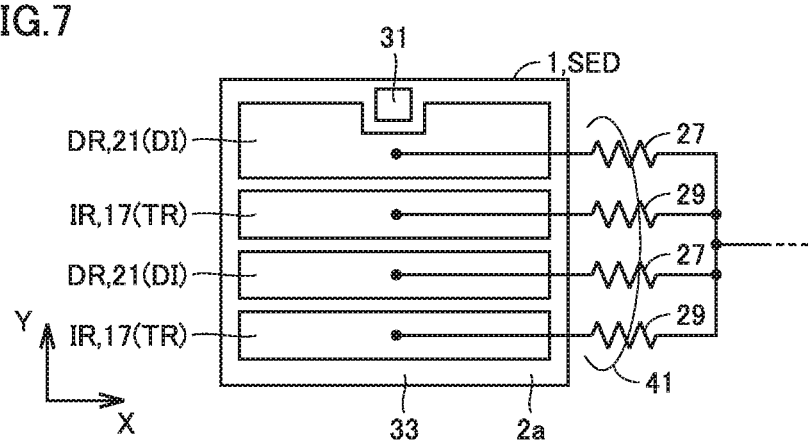
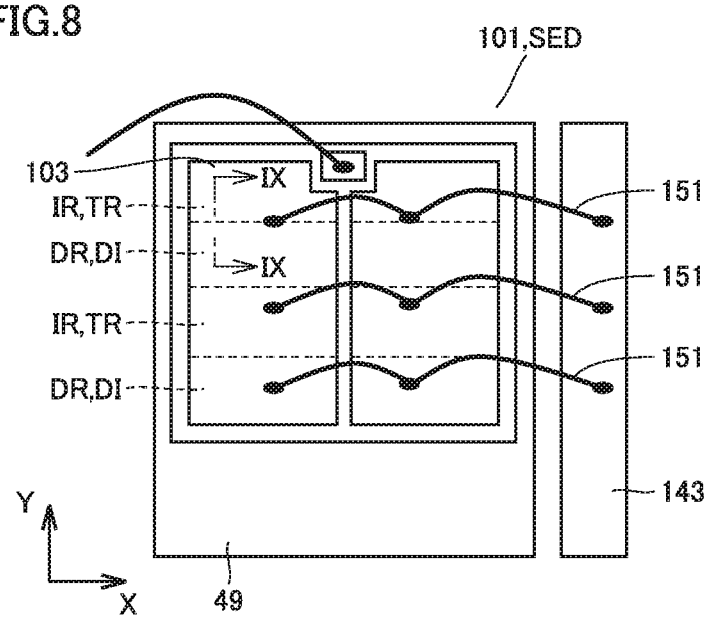

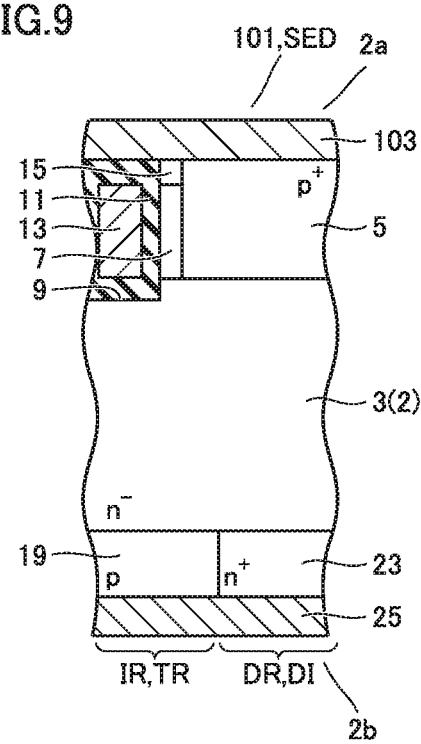
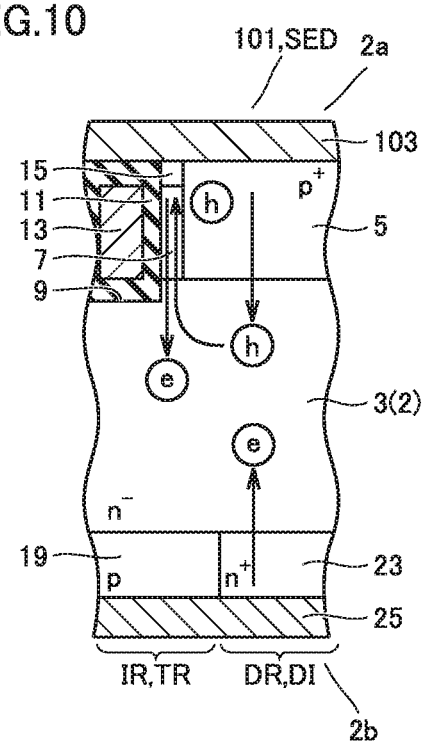

TR5: ON(SW)
TR6: ON
TR7: OFF
TR8: OFF($\overline{SW}$)

SEMICONDUCTOR DEVICE INCLUDING A SWITCHING ELEMENT IN A FIRST ELEMENT REGION AND A DIODE ELEMENT IN A SECOND ELEMENT REGION

BACKGROUND OF THE INVENTION

Field of the Invention

The present disclosure relates to a power semiconductor device.

Description of the Background Art

As an example of a power semiconductor device, there is a semiconductor device in which an insulated gate bipolar transistor and a diode are formed on one semiconductor substrate so as to reduce the package size. Such a semiconductor device is called a reverse conducting insulated gate bipolar transistor (RC-IGBT). Such a semiconductor device is disclosed in, for example, PTL 1 (WO 2018/225571), PTL 2 (Japanese Patent Laying-Open No. 2012-50065), PTL 3 (Japanese Patent Laying-Open No. 2011-210800), and PTL 4 (Japanese Patent Laying-Open No. 2016-72359).

In the RC-IGBT, an anode of a diode is arranged on the emitter side of the IGBT, and a cathode of the diode is arranged on the collector side of the IGBT. The RC-IGBT is mainly used as a voltage inverter which is widely used in a 2-level inverter circuit (half-bridge circuit), a multi-level inverter bridge circuit incorporated with the half-bridge circuit and the like.

In a circuit constituting the voltage inverter, since the direction of an output current flowing through the circuit is determined by a load, the circuit is preferred to be controlled to have a desired output potential regardless of the direction of the output current. The simplest method for realizing this control is to turn on the IGBT regardless of the direction of the flowing current when the IGBT should be turned on.

Due to the influence from the inductance or the like of the load connected to the circuit, the waveform of current lags behind than the waveform of voltage. Thus, immediately after the polarity of the voltage is switched from negative (positive) to positive (negative), the current may flow in a direction opposite to the polarity of the voltage. This current will flow through a diode connected in antiparallel to the IGBT. Thus, the IGBT may be turned on when there is a current flowing through the diode, and thereby a channel is formed in the IGBT.

SUMMARY OF THE INVENTION

In the diode of the RC-IGBT, in order to expand the depletion layer so as to ensure a breakdown voltage in the off state, a PIN structure including an intrinsic semiconductor layer that contains impurities at an extremely low concentration is employed. The intrinsic semiconductor layer is sandwiched between a p layer (anode) and an n layer (cathode).

On the other hand, in order to turn on the diode, a voltage is applied in the forward direction between the p layer and the n layer, so that holes are injected from the p layer into the intrinsic semiconductor layer and electrons are injected from the n layer into the intrinsic semiconductor layer, and thereby electrons and holes accumulate in the intrinsic semiconductor layer. Accordingly, the intrinsic semiconductor layer is turned into a metal state, which lowers the on-resistance.

The intrinsic semiconductor layer essentially contains almost no electrons or holes, and is in a thermally balanced state. Therefore, when electrons and holes accumulates in the intrinsic semiconductor layer and turns the intrinsic semiconductor layer into a metal state, and thus the intrinsic semiconductor layer is in a thermally unbalanced state. If a channel is formed in the IGBT when a current is flowing through the diode, electrons and holes in the intrinsic semiconductor layer attempt to cancel the thermally unbalanced state.

In other words, when electrons flow from the emitter of the IGBT into the intrinsic semiconductor layer through the channel, in order to neutralize the negative charges of the electrons flown into the intrinsic semiconductor layer, the holes accumulated in the intrinsic semiconductor layer flow into the channel. Thus, in the vicinity of a boundary between an IGBT region where the IGBT is formed and a diode region where the diode is formed, the on-resistance of the diode increases, and thereby the on-voltage of the diode increases. The on-voltage of a diode is called a forward voltage drop.

From the viewpoint of suppressing an increase in the on-resistance of the diode, it is preferable that the length of the boundary between the IGBT region and the diode region is made as short as possible. In order to shorten the length of the boundary, it is desirable not to divide and arrange the IGBT region and the diode region in small divisions. In a semiconductor device, the IGBT region and the diode region are often arranged in a stripe shape. In order to shorten the length of the boundary, for example, the width of the stripe is required to be set wider.

In a RC-IGBT, when a current is flowing through the IGBT, no current flows through the diode; and when a current is flowing through the diode, no current flows through the IGBT. Thus, when a current flows through the IGBT and heat is generated in the IGBT, the diode region where no current flows serves as a heat radiation path for the heat. When a current flows through the diode and heat is generated in the diode, the IGBT region where no current flows serves as a heat radiation path for the heat. Thus, from the viewpoint of enhancing the heat radiation effect, it is preferable that the length of the boundary between the IGBT region and the diode region is as long as possible. In order to increase the length of the boundary, for example, the width of the stripe is required to be set narrower.

Thus, in the RC-IGBT, for example, when the width of the stripe is wide and the length of the boundary is short, it is advantageous in that the increase in the on-voltage of the diode is suppressed, but disadvantageous in that the heat radiation effect is suppressed. On the contrary, when the width of the stripe is narrow and the length of the boundary is long, it is advantageous in that the heat radiation effect is enhanced, but disadvantageous in that the increase in the on-voltage of the diode is not suppressed.

The present disclosure has been made in view of the problems of such a semiconductor device (RC-IGBT), and an object thereof to provide a semiconductor device capable of suppressing an increase in the on-voltage of a diode while ensuring heat radiation effect.

A semiconductor device according to one aspect of the present disclosure is provided with a semiconductor chip unit which includes a first semiconductor chip. The first semiconductor chip has a first main surface and a second main surface facing each other. A first switching element is formed in a first element region defined on the first main surface. A first diode element is formed in the second element region defined on the first main surface. The first switching element includes a first emitter layer, a first collector layer, a first gate electrode, and a first electrode film. The first emitter layer is formed on the side of the first main surface. The first collector layer is formed on the side of the second main surface. The first gate electrode is formed on the side of the first main surface. The first electrode film is formed in contact with the first emitter layer. The first diode element includes a first anode layer, a first cathode layer, and a second electrode film. The first anode layer is formed on the side of the first main surface. The first cathode layer is formed on the side of the second main surface. The second electrode film is formed in contact with the first anode layer. The first electrode film in the first switching element and the second electrode film in the first diode element are separated from each other by a distance. The semiconductor device is further provided with a wiring conductor which includes a portion that electrically connects the first electrode film and the second electrode film and has an impedance.

A semiconductor device according to another aspect of the present disclosure is provided with a semiconductor chip unit which includes a first semiconductor chip and a second semiconductor chip. The first semiconductor chip has a first main surface and a second main surface facing each other. A first switching element is formed in a first element region defined on the first main surface. A first diode element is formed in the second element region defined on the first main surface. The second semiconductor chip has a third main surface and a fourth main surface facing each other. A second switching element is formed in a third element region defined on the third main surface. A second diode element is formed in a fourth element region defined on the third main surface. The first switching element includes a first emitter layer, a first collector layer, a first gate electrode, and a first electrode film. The first emitter layer is formed on the side of the first main surface. The first collector layer is formed on the side of the second main surface. The first gate electrode is formed on the side of the first main surface. The first electrode film is formed in contact with the first emitter layer. The first diode element includes a first anode layer, a first cathode layer, and a second electrode film. The first anode layer is formed on the side of the first main surface. The first cathode layer is formed on the side of the second main surface. The second electrode film is formed in contact with the first anode layer. The second switching element includes a second emitter layer, a second collector layer, a second gate electrode, and a third electrode film. The second emitter layer is formed on the side of the third main surface. The second collector layer is formed on the side of the fourth main surface. The second gate electrode is formed on the side of the third main surface. The third electrode film is formed in contact with the second emitter layer. The second diode element includes a second anode layer, a second cathode layer, and a fourth electrode film. The second anode layer is formed on the side of the third main surface. The second cathode layer is firmed on the side of the fourth main surface. The fourth electrode film is formed in contact with the second anode layer. The first electrode film in the first switching element and the second electrode film in the first diode element are separated from each other by a distance. The third electrode film in the second switching element and the fourth electrode film in the second diode element are separated from each other by a distance. The first collector layer and the first cathode layer are electrically connected. The second collector layer and the second cathode layer are electrically connected. The semiconductor device is further provided with a wiring conductor which includes a first wire and a second wire. The first wire electrically connects the first electrode film in the first switching element and the fourth electrode film in the second diode element. The second wire electrically connects the second electrode film in the first diode element and the third electrode film in the second switching element.

A semiconductor device according to still another aspect of the present disclosure is provided with a semiconductor chip. The semiconductor chip has a first main surface and a second main surface facing each other. A switching element is formed in the first element region defined on the first main surface. A diode element is formed in a second element region defined on the first main surface. The switching element includes an emitter layer, a collector layer, and a gate electrode. The emitter layer is formed on the side of the first main surface. The collector layer is formed on the side of the second main surface. The gate electrode is formed on the side of the first main surface. The diode element includes an anode layer and a cathode layer. The anode layer is formed on the side of the first main surface. The cathode layer is formed on the side of the second main surface. The semiconductor device is further provided with an electrode film and a wiring conductor. The electrode film is formed in contact with the emitter layer and the anode layer and arranged to cover the first main surface. The wiring conductor is electrically connected to the electrode film. The wiring conductor is connected to a position spaced by a distance from a portion of the electrode film located immediately above the boundary between the first element region and the second element region.

According to the semiconductor device in one aspect of the present disclosure, the first electrode film in the first switching element and the second electrode film in the first diode element are separated from each other by a distance, and the semiconductor device is further provided with a wiring conductor which includes a portion that electrically connects the first electrode film and the second electrode film and has an impedance. Thus, when the first switching element is turned on while a forward current is flowing through the first diode element, and thereby a channel is formed, carriers that are injected into the first diode element may be prevented from flowing into the channel. As a result, an increase in the on-voltage of the first diode element may be suppressed.

According to the semiconductor device in another aspect of the present disclosure, the first electrode film in the first switching element of the first semiconductor chip and the fourth electrode film in the second diode element of the second semiconductor chip are electrically connected by the first wire, and the second electrode film in the first diode element of the first semiconductor chip and the third electrode film in the second switching element of the second semiconductor chip are electrically connected by the second wire. Thus, when the first switching element is turned on while a forward current is flowing through the first diode element, and thereby a channel is formed, carriers that are injected into the first diode element may be prevented from flowing into the channel. As a result, an increase in the on-voltage of the first diode element may be suppressed.

According to the semiconductor device in still another aspect of the present disclosure, the wiring conductor electrically connected to the electrode film is connected to a position spaced by a distance from a portion of the electrode film located immediately above the boundary between the first element region and the second element region. Thus, when the first switching element is turned on while a forward current is flowing through the first diode element, and thereby a channel is formed, carriers that are injected into the first diode element may be prevented from flowing into the channel. As a result, an increase in the on-voltage of the first diode element may be suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram for explaining the operation of the inverter circuit;

FIG. 3 is a first diagram for explaining the operation of the 3-level inverter circuit;

FIG. 4 is a second diagram for explaining the operation of the 3-level inverter circuit;

FIG. 5 is a plan view illustrating an example of a planar structure of the semiconductor device according to a first embodiment;

FIG. 6 is a partial cross-sectional view taken along a section line VI-VI illustrated in FIG. 5 according to the first embodiment;

FIG. 7 is a plan view illustrating another example of the planar structure of the semiconductor device according to the first embodiment;

FIG. 8 is a plan view illustrating a planar structure of a semiconductor device according to a comparative example;

FIG. 9 is a partial cross-sectional view taken along a section line IX-IX illustrated in FIG. 8 according to the comparative example;

FIG. 10 is a partial cross-sectional view for explaining the operation of a semiconductor device according to the comparative example;

DESCRIPTION OF THE PREFERRED EMBODIMENTS

Figure 1:
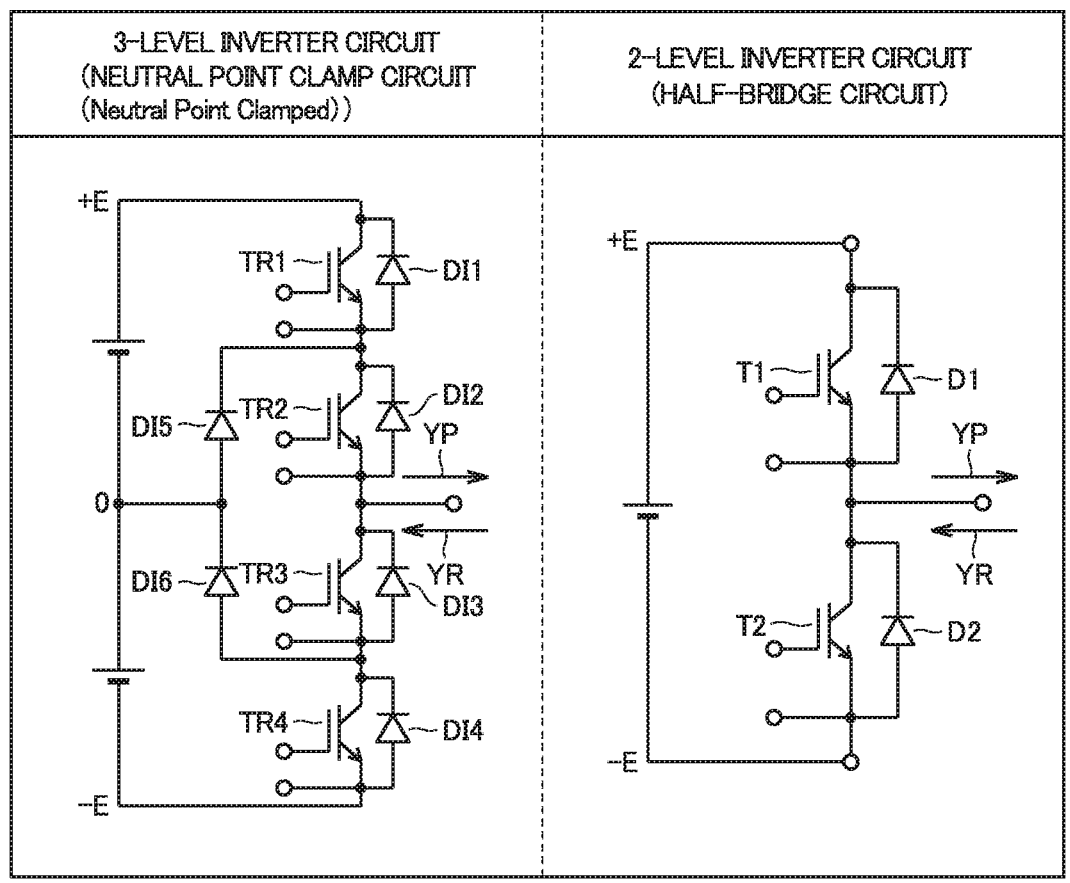
FIG. 1 is a diagram illustrating examples of a 2-level inverter circuit and a 3-level inverter circuit to which a semiconductor device according to each embodiment is applied.

Firstly, as a voltage inverter circuit to which a semiconductor device is applied, a 3-level inverter circuit incorporated with a 2-level inverter circuit (half-bridge circuit) will be described. FIG. 1 illustrates a 3-level inverter circuit and a half-bridge circuit as a basic circuit of the semiconductor device. As an example of a 3-level inverter circuit, a neutral point clamp circuit may be given. The 3-level inverter circuit illustrated in FIG. 1, for example, uses the potential at the neutral point as a reference potential.

A half-bridge circuit includes two IGBTs (T1 and T2) and two diodes (D1 and D2). The half-bridge circuit outputs two levels of voltages, i.e. +E and −E as output voltages. On the other hand, a 3-level inverter circuit includes four IGBTs (TR1, TR2, TR3, and TR4) and six diodes (DI1, DI2, DI3, DI4, DI5, and DI6). The 3-level inverter circuit outputs three levels of voltages, i.e. +E, 0 and −E as output voltages.

As illustrated in FIG. 2, in the 3-level inverter circuit, during a period of outputting two upper potentials (+E, 0), while the IGBT (TR2) is kept constantly ON and the IGBT (TR4) is kept constantly OFF, the IGBT (TR1) and the IGBT (TR3) are controlled as complementary switches so that when one switch is turned on, the other switch is turned off. Thus, the IGBT (TR1) and the IGBT (TR3) surrounded by a dotted frame operate as a half-bridge circuit.

On the other hand, during a period of outputting two lower potentials (0, −E), while the IGBT (TR1) is kept constantly OFF and the IGBT (TR3) is kept constantly ON, the IGBT (TR2) and the IGBT (TR4) are controlled as complementary switches so that when one switch is turned on, the other switch is turned off. Thus, the IGBT (TR2) and the IGBT (TR4) surrounded by a dotted frame operate as a half-bridge circuit.

The output voltage from a half-bridge circuit may be a high potential (High) or a low potential (Low). The direction of the output current may be a power running direction (illustrated by an arrow YP) or a regeneration direction (illustrated by an arrow YR) (see FIG. 1). The power running direction means that the direction of the current corresponds to the relationship (polarity) of the output potential relative to the potential at the neutral point. On the other hand, the regeneration direction means that the direction of the current is opposite to the relationship (polarity) of the output potential relative to the potential at the neutral point.

Based on the relationships mentioned above, the current flow in the 3-level inverter circuit is illustrated in FIGS. 3 and 4, respectively. FIG. 3 illustrates four patterns of the current flow (state C1, state C2, state C3, and state C4) during a period of outputting two upper potentials (+E, 0). FIG. 4 illustrates four patterns of the current flow (state C5, state C6, state C7, and state C8) during a period of outputting two lower potentials (0, −E).

Among the four patterns of the current flow illustrated in FIG. 3, in state C2, the current flows through the diode DI1 and the diode DI2 in the forward direction. This is because the waveform of the output current lags behind the waveform of the output voltage due to the influence from the inductance of a load connected to the 3-level inverter circuit. The period of state C2 corresponds to a period in which the current flows in the opposite direction to the polarity of the output voltage immediately after the polarity of the output voltage is switched from negative to positive.

During this period, although no current flows through the IGBT (TR1) and the IGBT (TR2), both of the IGBT (TR1) and the IGBT (TR2) are turned on for the control of the 3-level inverter circuit. As illustrated in FIG. 3, this state C2 corresponds to a state in which the IGBT (T1) in a half-bridge circuit is kept ON during a period in which a current is flowing through the diode D1 in the forward direction.

Among the four patterns of the current flow illustrated in FIG. 4, in state C8, the current flows through the diode DI3 and the diode DI4 in the forward direction. The period of state C8 corresponds to a period in which the current flows in the opposite direction to the polarity of the output voltage immediately after the polarity of the output voltage is switched from positive to negative.

During this period, although no current flows through the IGBT (TR3) and the IGBT (TR4), both of the IGBT (TR3) and the IGBT (TR4) are turned on for the control of the 3-level inverter circuit. As illustrated in FIG. 4, this state C8 corresponds to a state in which the IGBT (T2) in a half-bridge circuit is kept ON during a period in which a current is flowing through the diode D2 in the forward direction.

As described above, in a half-bridge circuit and a multi-level voltage inverter circuit incorporated with a half-bridge circuit, when the IGBT is turned on during a period in which a current is flowing through the diode in the forward direction, a channel is formed in the IGBT. In the RC-IGBT, when a channel is formed in the IGBT during a period in which a current is flowing through the diode, the electrons and the holes injected into the diode (intrinsic semiconductor layer) attempt to cancel the thermally unbalanced state, and as a result, the on-resistance of the diode increases and the on-voltage of the diode increases. Hereinafter, an RC-IGBT capable of suppressing an increase in the on-voltage of the diode will be described in detail in each embodiment.

First Embodiment

A semiconductor device according to a first embodiment will be described. In the present embodiment, the IGBT (TR) corresponds to a first switching element, and the diode DI corresponds to a first diode element.

As illustrated in FIGS. 5 and 6, a transistor region IR and a diode region DR are defined on a first main surface 2a of a semiconductor substrate 2 in a RC-IGBT chip 1 of the semiconductor device SED. An IGBT (TR) is formed in the transistor region IR. A diode DI is formed in the diode region DR. A guard ring region 33 is formed so as to surround the transistor region IR and the diode region DR.

In the transistor region IR, an n-type emitter layer 15 is formed on the side of the first main surface 2a of the semiconductor substrate 2. An emitter electrode film 17 is formed in contact with the emitter layer 15. A trench gate electrode 13 is formed in a trench 9 with a gate insulating film 11 interposed therebetween. A gate pad 31 is formed in electrical connection to the trench gate electrode 13.

A p-type impurity layer 7 in which a channel is to be formed is formed below the emitter layer 15. A p-type collector layer 19 is formed on the side of a second main surface 2b of the semiconductor substrate 2. An n− layer 3 is formed between the p-type impurity layer 7 and the collector layer 19 as an intrinsic semiconductor layer.

In the diode region DR, a p+ type anode layer 5 is formed on the side of the first main surface 2a of the semiconductor substrate 2. An anode electrode film 21 is formed in contact with the anode layer 5. An n+ type cathode layer 23 is formed on the side of the second main surface 2b of the semiconductor substrate 2. An n− layer 3 is formed between the anode layer 5 and the cathode layer 23 as an intrinsic semiconductor layer. A back electrode film 25 is formed on the side of the second main surface 2b of the semiconductor substrate 2 so as to be in contact with the collector layer 19 and the cathode layer 23.

In the RC-IGBT chip 1, the anode electrode film 21 and the emitter electrode film 17 are arranged with a distance therebetween. The anode electrode film 21 and the emitter electrode film 17 are electrically connected by a wiring conductor 41 having an external impedance 27 and an external impedance 29. The external impedance 27 and the external impedance 29 include the resistance of the wiring conductor 41 and the inductance of the wiring conductor 41. The wiring conductor 41 illustrated in FIG. 1 is merely used to indicate that the anode electrode film 21 and the emitter electrode film 17 are electrically connected in a circuit, and is not intended to limit the structure of the wiring conductor 41.

Note that the arrangement pattern of the transistor region IR and the diode region DR in the RC-IGBT chip 1 is not limited to the arrangement pattern illustrated in FIG. 5, and it is acceptable to adopt such an arrangement pattern that the transistor region IR and the diode region DR are interchanged as illustrated in FIG. 7.

In the semiconductor device SED described above, since the anode electrode film 21 and the emitter electrode film 17 are separated from each other with a distance and are electrically connected by the wiring conductor 41 having the external impedances 27 and 29, an increase in the on-voltage of the diode DI can be suppressed. This will be described in comparison with the semiconductor device according to a comparative example. Note that the same reference numerals are given to the same configurations in the semiconductor device according to the comparative example as those in the semiconductor device according to the first embodiment, and the description thereof will not be repeated unless necessary.

As illustrated in FIGS. 8 and 9, a transistor region IR and a diode region DR are defined on the first main surface 2a of the semiconductor substrate 2 in a RC-IGBT chip 101 of the semiconductor device SED according to the comparative example. An IGBT (TR) is formed in the transistor region IR. A diode DI is formed in the diode region DR.

On the first main surface 2a, an emitter/anode electrode film 103 is formed in contact with the emitter layer 15 of the IGBT (TR) and the anode layer 5 of the diode DI. The emitter/anode electrode film 103 is electrically connected to an external wiring 143 by a wire 151. A conductor plate 49 that is electrically connected to the back electrode film 25 is formed on the second main surface 2b. The semiconductor device SED according to the comparative example is configured as described above.

Next, the operation of the semiconductor device SED according to the comparative example will be described. As described above, in a half-bridge circuit and a multi-level voltage inverter circuit, when the IGBT is turned on during a period in which a current is flowing through the diode in the forward direction, a channel is formed in the IGBT (state C2 and state C8).

In order to turn on the diode DI and allow a current to flow in the forward direction, it is necessary to perform a conductivity modulation on the n– layer 3 serving as the intrinsic semiconductor layer. The conductivity modulation is a thermally unbalanced state where the density of intrinsic carriers is increased. In order to increase the density of intrinsic carriers, the n– layer 3 serving as the intrinsic semiconductor layer is required to be in an electrically floating state. In other words, it is required to stably generate a quasi-Fermi level that is far away from the Fermi level.

As illustrated in FIG. 10, when a forward voltage is applied to the diode DI having the n– layer 3 and holes (h) are injected into the n– layer 3, the quasi temperature of the n– layer 3 becomes extremely high, and thereby carriers of both electrons (e) and holes (h) increase in the n– layer 3. As a result, the n– layer 3 becomes metallic and its resistance decreases, allowing a current to flow in a forward direction between the anode layer 5 and the cathode layer 23.

If the IGBT (TR) is turned on during a period while a current is flowing through the diode DI in the forward direction, a channel is formed. Due to the formation of the channel, the potential of the n– layer 3 is connected to the potential of the anode electrode film 21, in other words, the potential in the vicinity of the Fermi level.

Thus, in order to cancel the thermally unbalanced state of the n– layer 3 which is an intrinsic semiconductor layer, electrons (e) flow into the n– layer 3 to lower the quasi temperature, which brings about such a phenomenon that many of the injected holes flow into the channel so as to neutralize the negative charges of the flown electrons. Thereby, in the portion of the diode region DR located nearby the channel, the resistance of the n– layer 3 increases. As a result, the on-voltage of the diode DI near the boundary between the IGBT (TR) and the diode DI increases.

In contrast to the semiconductor device SED according to the comparative example, in the semiconductor device SED according to the first embodiment, the anode electrode film 21 and the emitter electrode film 17 are arranged with a distance therebetween. The anode electrode film 21 and the emitter electrode film 17 are electrically connected by a wiring conductor 41 having an external impedance 27 and an external impedance 29.

Figure 11:
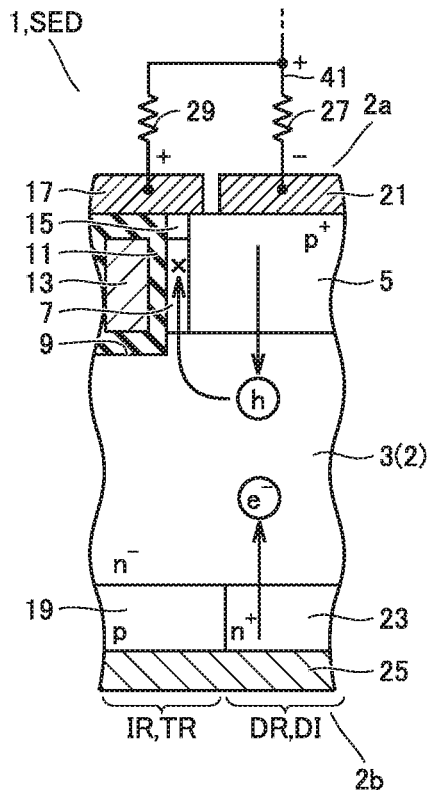
FIG. 11 is a partial cross-sectional view for explaining the operation of the semiconductor device according to the first embodiment.

As illustrated in FIG. 11, when a forward current flows through the diode DI, a potential difference is generated in the wiring conductor 41 electrically connected to the anode electrode film 21 due to the external impedance 27. The potential of a portion electrically connected to the emitter electrode film 17 becomes higher than the potential of a portion connected to the anode electrode film 21. Since no current flows through the IGBT (TR), the potential of the emitter electrode film 17 to which the wiring conductor 41 is electrically connected becomes higher than the potential of the anode electrode film 21.

From the viewpoint of the operation of the IGBT (TR) and the viewpoint of further suppressing the voltage drop, the external impedance 29 of the wiring conductor 41 electrically connected to the emitter electrode film 17 is preferably smaller than the external impedance 27.

As described above, since the potential of the emitter electrode film 17 is biased higher than the potential of the anode electrode film 21, the holes flowing into the channel are difficult to escape to the side of the emitter electrode film 17. Thereby, it is possible to prevent the electrons (e) and the holes (h) in the n– layer 3 of the diode DI from decreasing, which makes it possible to suppress an increase in the on-voltage of the diode DI.

Further, in the semiconductor device SED, the increase in the on-voltage of the diode DI is suppressed by the bias potential applied to the emitter electrode film 17, and thus, the length of the boundary between the transistor region IR and the diode region DR may be made longer without affect the on-voltage of the diode DI. As a result, it is possible to suppress an increase in the on-voltage of the diode DI while maintaining the heat radiation effect by setting the boundary between the transistor region IR and the diode region DR longer.

Second Embodiment

Figure 12:
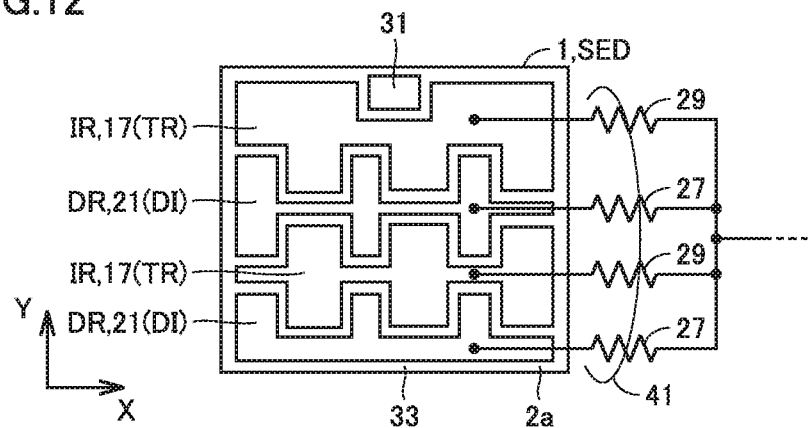
FIG. 12 is a plan view illustrating a planar structure of a semiconductor device according to a second embodiment.

A semiconductor device according to a second embodiment will be described. As illustrated in FIG. 12, a transistor region IR and a diode region DR are defined on the first main surface 2a of the semiconductor substrate 2 in the RC-IGBT chip 1 of the semiconductor device SED. An IGBT (TR) is formed in the transistor region IR. An emitter electrode film 17 is formed in contact with emitter layer 15. A diode DI is formed in the diode region DR. An anode electrode film 21 is formed in contact with the anode layer 5.

The anode electrode film 21 and the emitter electrode film 17 are arranged with a distance therebetween. The anode electrode film 21 and the emitter electrode film 17 are electrically connected by a wiring conductor 41 having external impedances 27 and 29.

The emitter electrode film 17 (transistor region IR) and the anode electrode film 21 (diode region DR) are formed in such a manner that one region enters the other region. The portion located between the emitter electrode film 17 (transistor region IR) and the anode electrode film 21 (diode region DR) has a curved pattern.

Since the other configurations are the same as those of the semiconductor device SED illustrated in FIGS. 5 and 6 or the like, the same members are denoted by the same reference numerals, and the description thereof will not be repeated unless necessary.

Similar to the semiconductor device SED described above, in the semiconductor device according to the present embodiment, since the potential of the emitter electrode film 17 is biased higher than the potential of the anode electrode film 21, the holes flowing into the channel are difficult to escape to the side of the emitter electrode film 17. Thereby, it is possible to prevent the electrons (e) and the holes (h) in the n– layer 3 of the diode DI from decreasing, which makes it possible to suppress an increase in the on-voltage of the diode DI.

In addition, the emitter electrode film 17 and the anode electrode film 21 are formed in such a manner that the boundary portion located between the emitter electrode film 17 and the anode electrode film 21 has a curved pattern, which makes the length of the boundary portion longer than the length of the boundary portion which is formed in a straight line.

As described above, in the semiconductor device SED, the increase in the on-voltage of the diode DI is suppressed by the bias potential applied to the emitter electrode film 17, and thus, the length of the boundary between the transistor region IR and the diode region DR may be made longer without affect the on-voltage of the diode DI.

Thereby, heat generated in the transistor region IR due to the current flowing through the IGBT (TR) may be efficiently radiated to the diode region DR where no current is flowing. On the other hand, heat generated in the diode region DR due to the current flowing through the diode DI may be efficiently radiated to the transistor region IR where no current is flowing. As a result, it is possible to suppress an increase in the on-voltage of the diode DI while enhancing the heat radiation effect.

Third Embodiment

A semiconductor device according to a third embodiment will be described. In the present embodiment, the IGBT (TR) in the inverter circuit corresponds to a first-switching-element first portion and a first-switching-element second portion, and the diode DI in the converter circuit corresponds to a first-diode-element first portion and a first-diode-element second portion.

Figure 13:
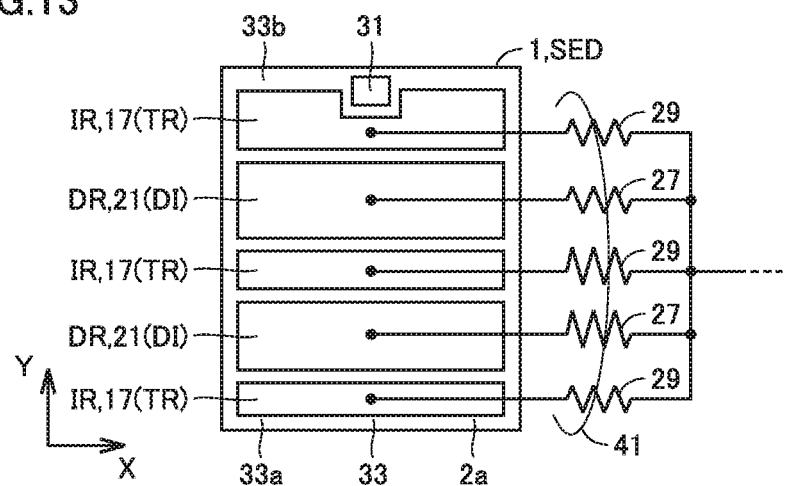
FIG. 13 is a plan view illustrating a first example of a planar structure of a semiconductor device according to a third embodiment.

As illustrated in FIG. 13, a transistor region IR and a diode region DR are defined on the first main surface 2a of the semiconductor substrate 2 in the RC-IGBT chip 1 of the semiconductor device SED. A guard ring region 33 is formed so as to surround the transistor region IR and the diode region DR.

The guard ring region 33 is formed along the outer periphery of the RC-IGBT chip 1. The guard ring regions 33 includes a first outer peripheral portion 33a and a second outer peripheral portion 33b both extending in the X-axis direction and separated by a distance in the Y-axis direction. The first outer peripheral portion 33a is arranged to face one emitter electrode film 17 (transistor region IR), and the second outer peripheral portion 33b is arranged to face another emitter electrode film 17 (transistor region IR). The diode region DR is disposed between one transistor region IR and another transistor region IR.

Since the other configurations are the same as those of the semiconductor device SED illustrated in FIGS. 5 and 6 or the like, the same members are denoted by the same reference numerals, and the description thereof will not be repeated unless necessary.

According to the semiconductor device SED described above, the following effect may be obtained in addition to the effect of suppressing an increase in the on-voltage of the diode DI as described in the first embodiment.

When the semiconductor device SED including the RC-IGBT chip 1 is applied to, for example, an inverter circuit, the amount of heat generated in the IGBT (TR) is larger than the amount of heat generated in the diode DI. Therefore, the length of the transistor region IR facing the guard ring region 33 (the first outer peripheral portion 33a or the second outer peripheral portion 33b) is made longer than the length of the diode region DR facing the guard ring region 33, which makes it possible to easily radiate the larger amount of heat generated in the transistor region IR to the outside of the RC-IGBT chip 1.

Figure 14:
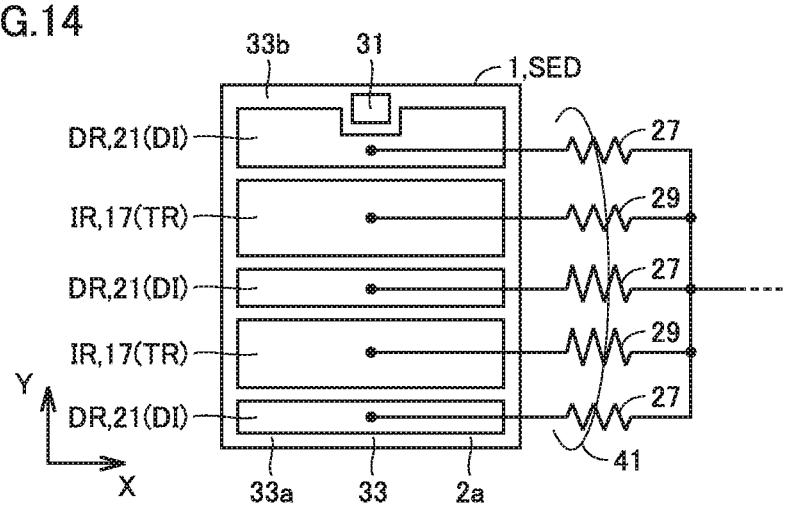
FIG. 14 is a plan view illustrating a second example of the planar structure of semiconductor device according to the third embodiment.

On the other hand, when the semiconductor device SED including the RC-IGBT chip 1 is applied to, for example, a converter circuit, the amount of heat generated in the diode DI is larger than the amount of heat generated in the IGBT (TR). In this case, as illustrated in FIG. 14, the length of the diode region DR facing the guard ring region 33 (the first outer peripheral portion 33a or the second outer peripheral portion 33b) is made longer than the length of the transistor region IR facing the guard ring region 33, which makes it possible to easily radiate the larger amount of heat generated in the diode region DR to the outside of the RC-IGBT chip 1.

Figure 15:
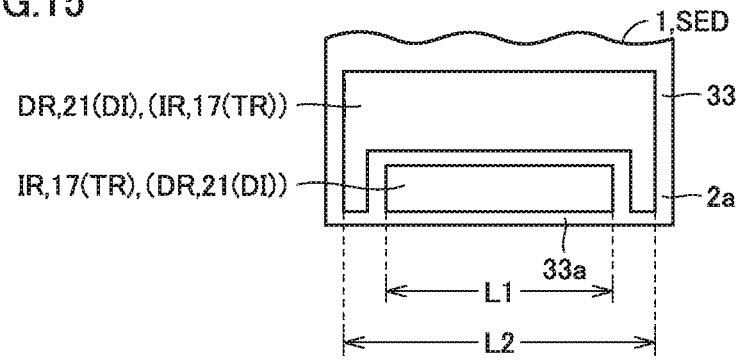
FIG. 15 is a partial plan view illustrating a dimensional relationship between an IGBT region and a diode region according to the third embodiment.

Further, in the case of the inverter circuit, in the semiconductor device SED, for example, in consideration of the power factor of an induction motor, the heat radiation capability of the heat generated in the transistor region IR is generally designed about twice the heat radiation capability of the heat generated in the diode region DR. Thus, as illustrated in FIG. 15, it is preferable that the length L1 of the transistor region IR at one side of the RC-IGBT chip 1 is set to ⅔ or more of the length L2 of the first outer peripheral portion 33a of the guard ring region 33.

On the other hand, in the case of the converter circuit, it is preferable that the length L1 of the diode region DR at one side of the RC-IGBT chip 1 which generates a larger amount of heat is set to ⅔ or more of the length L2 of the first outer peripheral portion 33a of the guard ring region 33.

Fourth Embodiment

Figure 16:
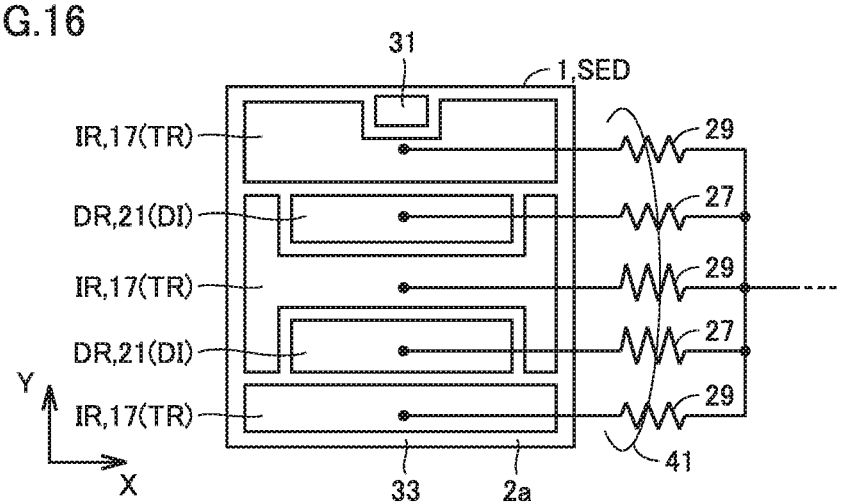
FIG. 16 is a plan view illustrating a planar structure of a semiconductor device according to a fourth embodiment.

A semiconductor device according to a fourth embodiment will be described. As illustrated in FIG. 16, a transistor region IR and a diode region DR are defined on the first main surface 2a of the semiconductor substrate 2 in the RC-IGBT chip 1 of the semiconductor device SED. A guard ring region 33 is formed so as to surround the transistor region IR and the diode region DR. The guard ring region 33 is formed along the outer periphery of the RC-IGBT chip 1.

The emitter electrode film 17 (transistor region IR) faces the guard ring region 33. The anode electrode film 21 (diode region DR) does not face the guard ring region 33. Since the other configurations are the same as those of the semiconductor device SED illustrated in FIGS. 5 and 6 or the like, the same members are denoted by the same reference numerals, and the description thereof will not be repeated unless necessary.

According to the semiconductor device SED described above, the following effect may be obtained in addition to the effect of suppressing an increase in the on-voltage of the diode DI as described in the first embodiment.

The guard ring region 33 is formed along the outer periphery of the RC-IGBT chip 1 to prevent leakage current. The emitter electrode film 17 (transistor region IR) is arranged to face the guard ring region 33, but the anode electrode film 21 (diode region DR) is not arranged to face the guard ring region 33.

Thereby, it is possible to prevent the carriers of the diode DI from flowing into the guard ring region 33 so as to prevent the carriers from being accumulated in the guard ring region 33, which makes it possible to shorten the recovery time of the diode DI.

Fifth Embodiment

A semiconductor device according to a fifth embodiment will be described. In the present embodiment, the IGBT (TR) corresponds to a first-switching-element third portion and a first-switching-element fourth portion, and the diode DI corresponds to a first-diode-element third portion and a first-diode-element fourth portion.

Figure 17:
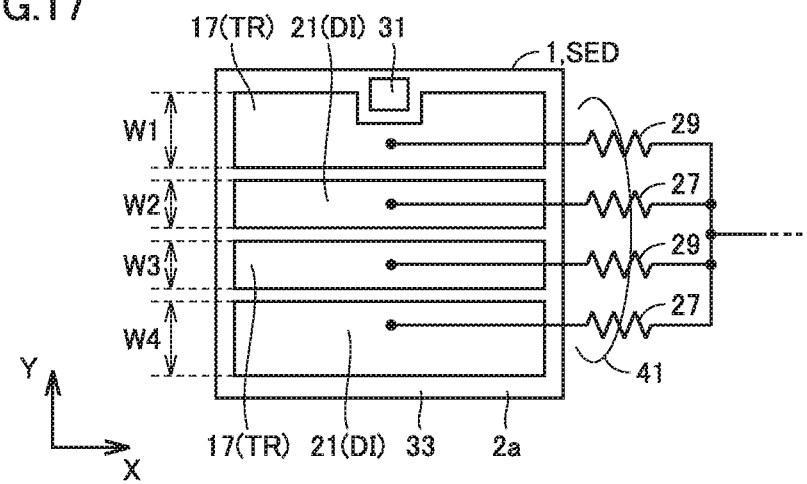
FIG. 17 is a plan view illustrating a planar structure of a semiconductor device according to a fifth embodiment.

As illustrated in FIG. 17, a transistor region IR and a diode region DR are defined on the first main surface 2a of the semiconductor substrate 2 in the RC-IGBT chip 1 of the semiconductor device SED. A guard ring region 33 is formed so as to surround the transistor region IR and the diode region DR.

If the width of one emitter electrode film 17 (transistor region IR) is denoted by W1 and the width of another emitter electrode film 17 (transistor region IR) is denoted by W3, the width W1 is set wider than the width W3. The length of one emitter electrode film 17 (transistor region IR) which has the width W1 and faces the guard ring region 33 is longer than the length of the other emitter electrode film 17 (transistor region IR) which has the width W3 and faces the guard ring region 33. The area of one emitter electrode film 17 (transistor region IR) is set larger than the area of the other emitter electrode film 17 (transistor region IR).

If the width of one diode region DR is denoted by W2 and the width of another diode region DR is denoted by W4, the width W4 is set wider than the width W2. The length of one anode electrode film 21 (diode region DR) which has the width W4 and faces the guard ring region 33 is longer than the length of the other anode electrode film 21 (diode region DR) which has the width W4 and faces the guard ring region 33. The area of one anode electrode film 21 (diode region DR) is set larger than the area of the other anode electrode film 21 (diode region DR).

Since the other configurations are the same as those of the semiconductor device SED illustrated in FIGS. 5 and 6 or the like, the same members are denoted by the same reference numerals, and the description thereof will not be repeated unless necessary.

According to the semiconductor device SED described above, the following effect may be obtained in addition to the effect of suppressing an increase in the on-voltage of the diode DI as described in the first embodiment.

In the RC-IGBT chip 1, the length of one emitter electrode film 17 (transistor region IR) facing the guard ring region 33 is set longer than the length of another emitter electrode film 17 (transistor region IR) facing the guard ring region 33. Furthermore, the area of one emitter electrode film 17 (transistor region IR) is set larger than the area of the other emitter electrode film 17 (transistor region IR).

The length of one anode electrode film 21 (diode region DR) facing the guard ring region 33 is set longer than the length of another anode electrode film 21 (diode region DR) facing the guard ring region 33. Furthermore, the area of one anode electrode film 21 (diode region DR) is set larger than the area of the other anode electrode film 21 (diode region DR).

Thus, one emitter electrode film 17 (transistor region IR) which a larger area (width W1) is located at the end of the RC-IGBT chip 1 relative to another emitter electrode film 17 (transistor region IR) which has a smaller area (width W2) and is advantageous for heat radiation. The anode electrode film 21 (diode region DR) which has a larger area (width W4) is located at the end of the RC-IGBT chip 1 relative to another anode electrode film 21 (diode region DR) which has a small area (width W3) and is advantageous for heat radiation.

Thus, during the period in which a forward current is flowing through the diode DI, the forward voltage drop (on-voltage) of the diode DI in the other diode region DR having a smaller area increases, which makes it difficult for the forward current to flow through the diode DI in the other diode region DR. Accordingly, the current flowing through the diode DI in the one diode region DR having a larger area increases.

Since the diode region DR having a larger area is arranged at the end of the RC-IGBT chip 1, it is possible to efficiently radiate the heat generated by the forward current flowing through the diode DI including the excessive forward current to the outside of the RC-IGBT chip 1. The same applies to the IGBT (TR).

Sixth Embodiment

A semiconductor device according to a sixth embodiment will be described. In the present embodiment, the IGBT (TR) corresponds to a first-switching-element fifth portion and a first-switching-element sixth portion, and the diode DI corresponds to a first-diode-element fifth portion and a first-diode-element sixth portion.

Figure 18:
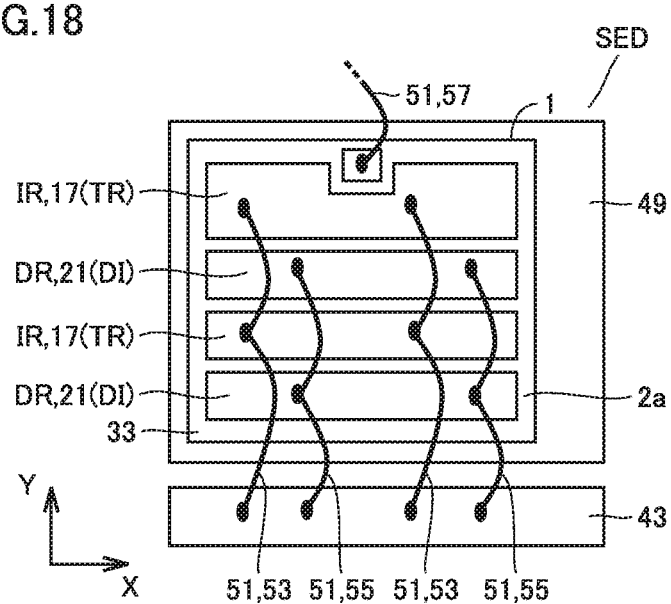
FIG. 18 is a plan view illustrating a planar structure of a semiconductor device according to a sixth embodiment.

As illustrated in FIG. 18, a transistor region IR and a diode region DR are defined on the first main surface 2a of the semiconductor substrate 2 in the RC-IGBT chip 1 of the semiconductor device SED. The transistor region IR and the diode region DR each has a width in the Y-axis direction and extends in the X-axis direction, for example. The RC-IGBT chip 1 is mounted on a conductor plate 49. The conductor plate 49 is arranged in contact with the back electrode film 25 (see FIG. 6).

A first external wiring 43 is arranged at one side of the RC-IGBT chip 1 as the wiring conductor 41. One emitter electrode film 17 (IGBT (TR)) and the other emitter electrode film 17 (IGBT (TR)) are electrically connected to the first external wiring 43 by a wire 53. The wire 53 extends in a direction (Y-axis direction) that intersects the direction in which the region IR extends.

One anode electrode film 21 (diode DI) and the other anode electrode film 21 (diode DI) are electrically connected to the first external wiring 43 by a wire 55. The wire 55 extends in a direction (Y-axis direction) intersecting the direction in which the diode region DR extends.

Since the other configurations are the same as those of the semiconductor device SED illustrated in FIGS. 5 and 6 or the like, the same members are denoted by the same reference numerals, and the description thereof will not be repeated unless necessary.

In the semiconductor device SED described above, during a period in which a forward current is flowing through the diode DI, the emitter electrode film 17 of the IGBT (TR) is applied via the wire 53 with a potential that corresponds to the potential difference caused by the impedance of the wire 55 between the diode DI and the first external wiring 43 and that is higher than the potential of the anode electrode film 21. Thereby, compared with the case where the emitter electrode film 17 and the anode electrode film 21 which are adjacent to each other are connected by a wire, it is possible to suppress an increase in the on-voltage of the diode DI.

Further, the IGBTs (TR) are electrically connected to each other by the wire 53. The diodes DI are electrically connected to each other by the wire 55. The wire 53 extends in a direction intersecting the direction in which the transistor region IR extends. The wire 55 extends in a direction intersecting with the direction in which the diode region DR extends. Thus, the electrical connection between the IGBTs (TR) and the electrical connection between the diodes DI each is substantially the shortest. As a result, it is possible to improve the current balance.

Seventh Embodiment

A semiconductor device according to a seventh embodiment will be described.

Figure 19:
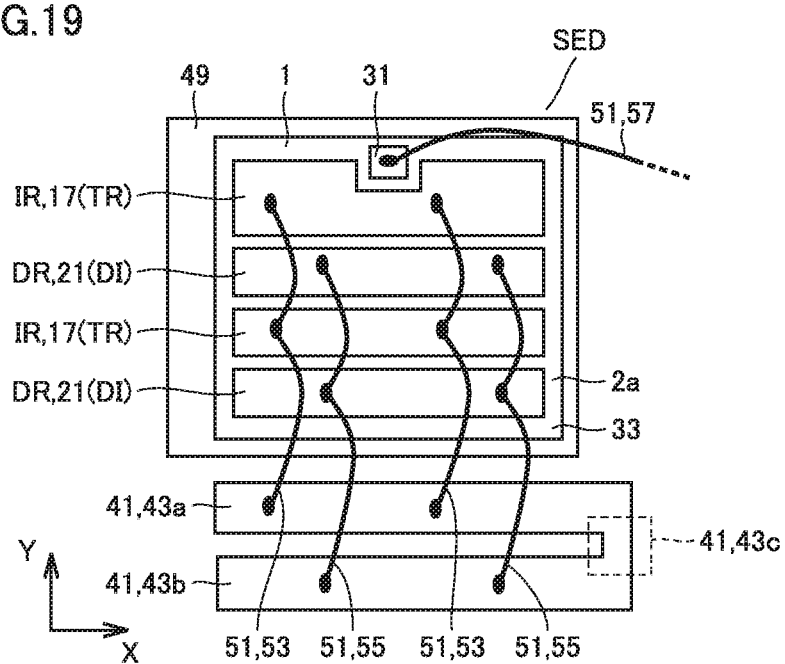
FIG. 19 is a plan view illustrating a planar structure of a semiconductor device according to a seventh embodiment.

As illustrated in FIG. 19, a transistor region IR and a diode region DR are defined on the first main surface 2a of the semiconductor substrate 2 in the RC-IGBT chip 1 of the semiconductor device SED. The transistor region IR and the diode region DR each has a width in the Y-axis direction and extends in the X-axis direction, for example. A first-external-wiring first portion 43a, a first-external-wiring second portion 43b, and a joining portion 43c are arranged at one side of the RC-IGBT chip 1 as the wiring conductor 41. The first-external-wiring first portion 43a and the first-external-wiring second portion 43b are joined together by the joining portion 43c.

One emitter electrode film 17 (IGBT (TR)) and the other emitter electrode film 17 (IGBT (TR)) are electrically connected to the first-external-wiring first portion 43a by a wire 53. The wire 53 Extends in a direction (Y-axis direction) intersecting the direction in which the transistor region IR extends.

One anode electrode film 21 (diode DI) and the other anode electrode film 21 (diode DI) are electrically connected to the first-external-wiring second portion 43b by a wire 55. The wire 55 extends in a direction (Y-axis direction) intersecting the direction in which the diode region DR extends.

Since the other configurations are the same as those of the semiconductor device SED illustrated in FIGS. 5 and 6 or FIG. 18 or the like, the same members are denoted by the same reference numerals, and the description thereof will not be repeated unless necessary.

In the semiconductor device SED described above, the wire 53 that electrically connects the IGBTs (TR) to each other is connected to the first-external-wiring first portion 43a. The wire 55 that electrically connects the diodes DI to each other is connected to the first-external-wiring second portion 43b. The first-external-wiring first portion 43a and the first-external-wiring second portion 43b are joined together by the joining portion 43c.

Thus, compared with the case where the first external wiring 43 (see FIG. 18) is disposed, it is possible to apply a potential higher than the potential of the anode electrode film 21 to the emitter electrode film 17 of the IGBT (TR), which makes it possible to effectively suppress an increase in the on-voltage of the diode DI.

Eighth Embodiment

A semiconductor device according to an eighth embodiment will be described. In the present embodiment, the IGBT (TR) of a first RC-IGBT chip corresponds to a first switching element, and the diode DI thereof corresponds to a first diode element. The IGBT (TR) of a second RC-IGBT chip corresponds to a second switching element, and the diode DI thereof corresponds to a second diode element.

Figure 20:
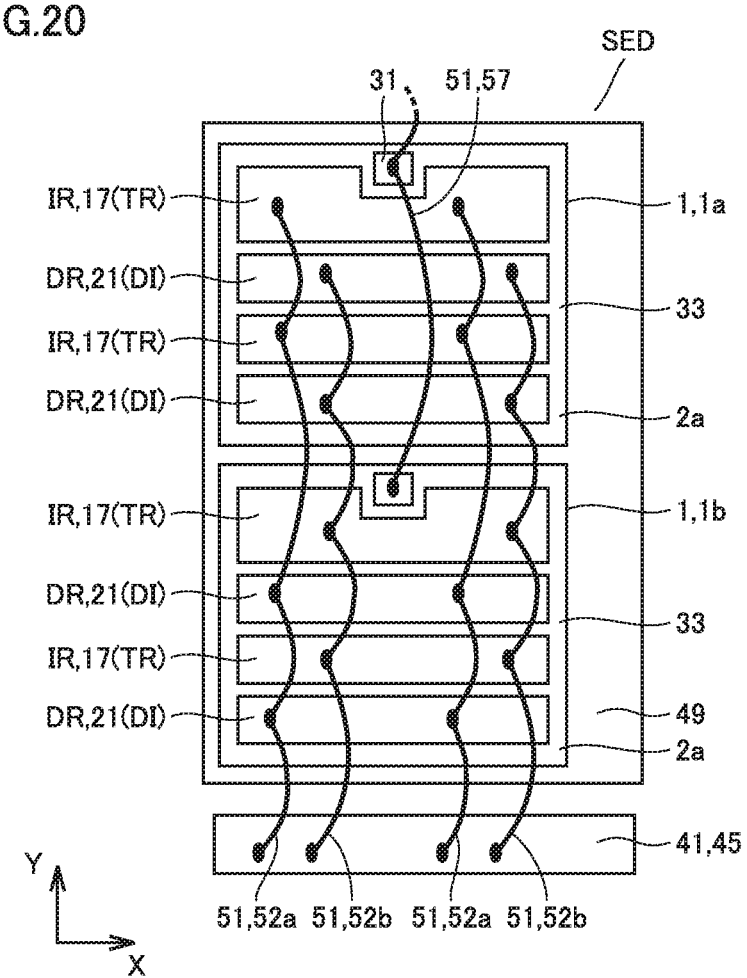
FIG. 20 is a plan view illustrating a planar structure of a semiconductor device according to an eighth embodiment.

As illustrated in FIG. 20, a first RC-IGBT chip 1a and a second RC-IGBT chip 1b are disposed in the semiconductor device SED as the RC-IGBT chip 1. A conductor plate 49 is disposed so as to be in contact with the back electrode film 25 (see FIG. 6) of each of the first RC-IGBT chip 1a and the second RC-IGBT chip 1b.

A transistor region IR and a diode region DR are defined on the first main surface 2a of the semiconductor substrate 2 in the first RC-IGBT chip 1a. A guard ring region 33 is formed so as to surround the transistor region IR and the diode region DR. A transistor region IR and a diode region DR are defined on the first main surface 2a of the semiconductor substrate 2 in the second RC-IGBT chip 1b. A guard ring region 33 is formed so as to surround the transistor region IR and the diode region DR. A second external wiring 45 is arranged at one side of the second RC-IGBT chip 1b.

The emitter electrode film 17 (IGBT (TR)) of the first RC-IGBT chip 1a and the anode electrode film 21 (diode (DI)) of the second RC-IGBT chip 1b are electrically connected to the second external wiring 45 by a wire 52a. The anode electrode film 21 (diode DI) of the first RC-IGBT chip 1a and the emitter electrode film 17 (IGBT (TR)) of the second RC-IGBT chip 1b are electrically connected to the second external wiring 45 by a wire 52b.

The gate pad 31 of the first RC-IGBT chip 1a and the gate pad 31 of the second RC-IGBT chip 1b are electrically connected by a wire 57. The other configurations are the same as those of the semiconductor device SED illustrated in FIGS. 5 and 6 or FIG. 18 or the like, the same members are denoted by the same reference numerals, and the description thereof will not be repeated unless necessary.

The semiconductor device SED generally has a relatively large amount of current to be controlled. In this case, a semiconductor device SED in which a plurality of RC-IGBT chips 1 are electrically connected in parallel may be used. In the above-described semiconductor device SED, the first RC-IGBT chip 1a and the second RC-IGBT chip 1b are electrically connected in parallel in the following manner.

The emitter electrode film 17 of the first RC-IGBT chip 1a and the anode electrode film 21 of the second RC-IGBT chip 1b are electrically connected to the second external wiring 45 by the wire 52a. The anode electrode film 21 of the first RC-IGBT chip 1a and the emitter electrode film 17 of the second RC-IGBT chip 1b are electrically connected to the second external wiring 45 by the wire 52b.

In the semiconductor device described above, in addition to the effects described in the first embodiment, it is possible to achieve a current balance. This will be described with comparison to the semiconductor device according to a comparative example.

Figure 21:
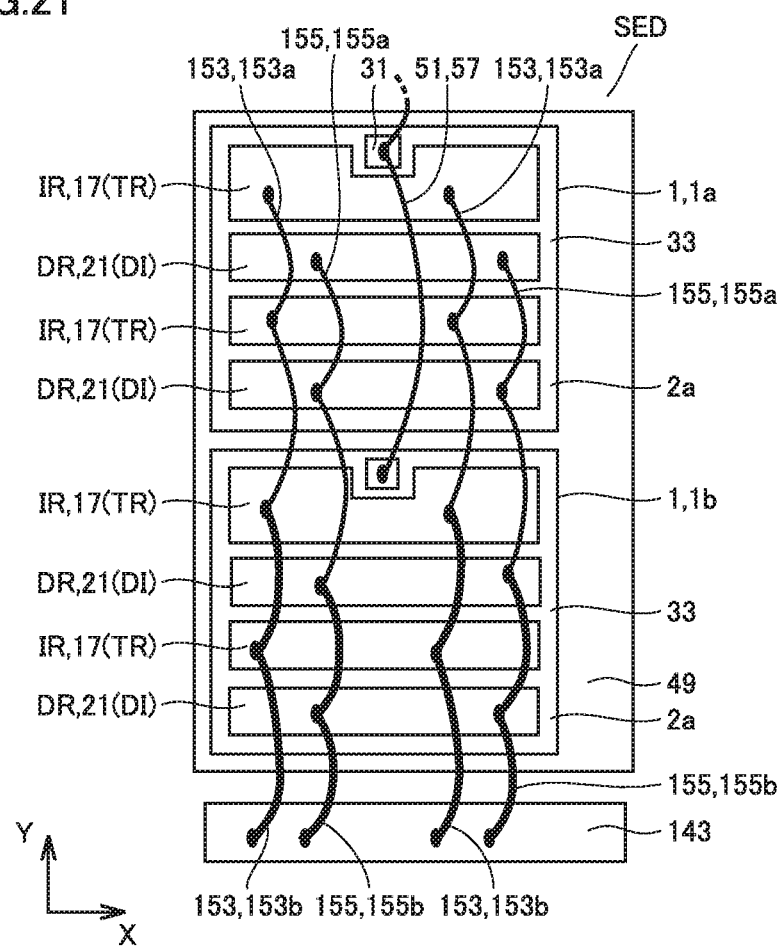
FIG. 21 is a plan view illustrating a planar structure of a semiconductor device according to a comparative example.

As illustrated in FIG. 21, in the semiconductor device SED according to the comparative example, the plurality of RC-IGBT chips 1 are electrically connected in parallel in the following manner. The emitter electrode film 17 of the first RC-IGBT chip 1a and the emitter electrode film 17 of the second RC-IGBT chip 1b are electrically connected to the external wiring 143 by wires 153a and 153b.

The emitter electrode film 17 of the first RC-IGBT chip 1a is electrically connected to the emitter electrode film 17 of the second RC-IGBT chip 1b by the wire 153a. The emitter electrode film 17 of the second RC-IGBT chip 1b is electrically connected to the external wiring 143 by the wire 153b. The size of the wire 153b is set larger than the size of the wire 153a.

The anode electrode film 21 of the first RC-IGBT chip 1a and the anode electrode film 21 of the second RC-IGBT chip 1b are electrically connected to the external wiring 143 by wires 155a and 155b.

The anode electrode film 21 of the first RC-IGBT chip 1a is electrically connected to the anode electrode film 21 of the second RC-IGBT chip 1b by the wire 155a. The anode electrode film 21 of the second RC-IGBT chip 1b is electrically connected to the external wiring 143 by the wire 155b. The size of the wire 155b is set larger than the size of the wire 155a.

In the semiconductor device SED according to the comparative example, in particular, a current from one IGBT (TR) of the first RC-IGBT chip 1a and one IGBT (TR) of the second RC-IGBT chip 1b flows through the wire 153b, and a current from one IGBT (TR) of the first RC-IGBT chip 1a flows through the wire 153a. Thus, the balance of time variation (di/dt) of the current flowing through each of the two IGBTs (TR) electrically connected in parallel is deteriorated.

Compared with the semiconductor device SED according to the comparative example, in the semiconductor device SED according to the eighth embodiment, the emitter electrode film 17 of the first RC-IGBT chip 1a and the anode electrode film 21 of the second RC-IGBT chip 1b are electrically connected to the second external wiring 45 by the wire 52a. The anode electrode film 21 of the first RC-IGBT chip 1a and the emitter electrode film 17 of the second RC-IGBT chip 1b are electrically connected to the second external wiring 45 by the wire 52b.

Thereby, a current from one IGBT (TR) of the first RC-IGBT chip 1a flows through the wire 52a, and a current from one IGBT (TR) of the second RC-IGBT chip 1b flows through the wire 52b. As a result, the balance of time variation (di/dt) of the current flowing through each of the two IGBTs (TR) electrically connected in parallel may be improved as compared with the semiconductor device SED according to the comparative example.

Ninth Embodiment

A semiconductor device according to a ninth embodiment will be described. In the present embodiment, the IGBT (TR) of the first RC-IGBT chip corresponds to a first switching element, and the diode DI of the first RC-IGBT chip corresponds to a first diode element. The IGBT (TR) of the second RC-IGBT chip corresponds to a second switching element, and the diode DI of the second RC-IGBT chip corresponds to a second diode element.

In the first embodiment and the like, a neutral point clamp circuit is given as an example of the 3-level inverter circuit. In the present embodiment, a neutral point switching type 3-level inverter circuit will be described as another example of the 3-level inverter circuit.

Figure 22:
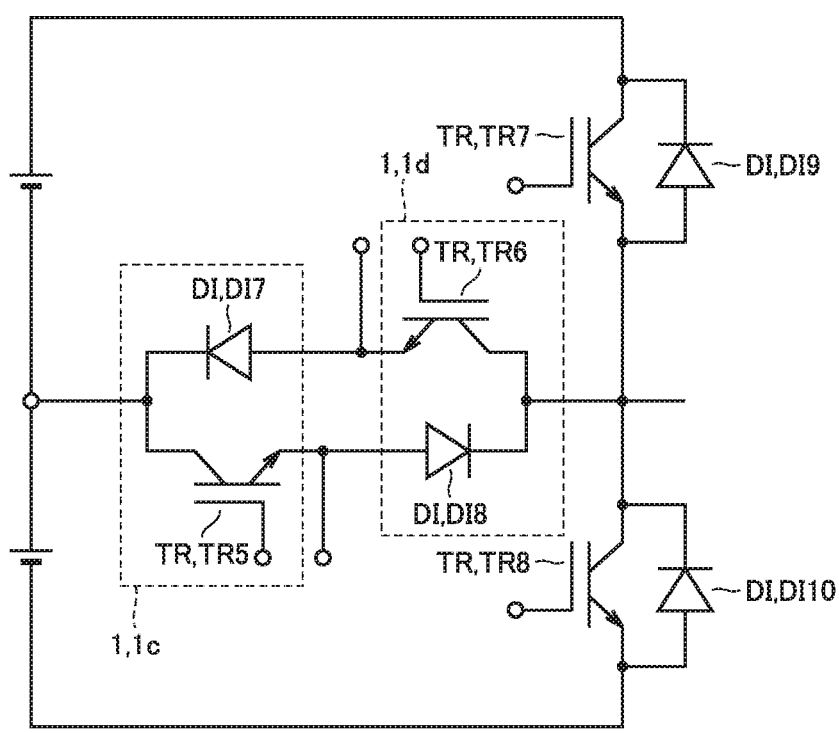
FIG. 22 is a diagram illustrating an example of an inverter circuit to which a semiconductor device according to a ninth embodiment is applied.

FIG. 22 illustrates a neutral point switching type 3-level inverter circuit. As illustrated in FIG. 22, the 3-level inverter circuit of the neutral point switching type includes four IGBTs (TR5, TR6, TR7 and TR8), and four diodes (DI7, DI8, DI9 and DI10).

The IGBT (TR (TR5)) and the diode DI (DI7) are formed in the first RC-IGBT chip 1c. The IGBT (TR (TR6)) and the diode DI (DI8) are formed in the second RC-IGBT chip 1d.

Figure 23:
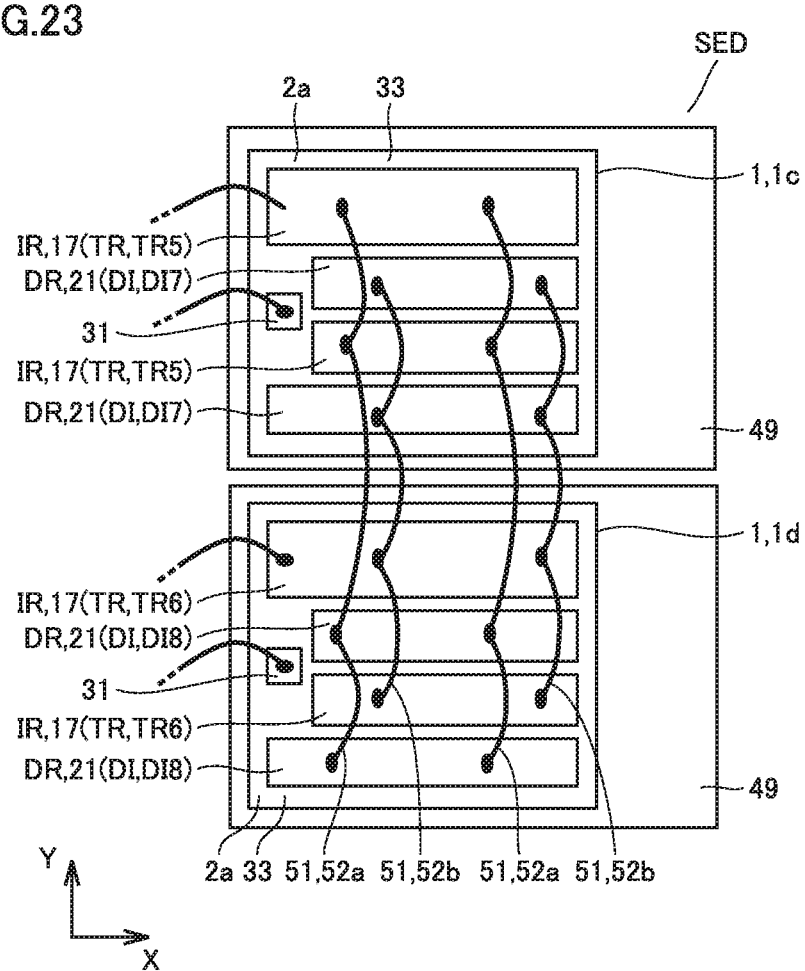
FIG. 23 is a plan view illustrating a planar structure of the semiconductor device according to the ninth embodiment.

As illustrated in FIG. 23, the emitter electrode film 17 of the IGBT (TR (TR5)) of the first RC-IGBT chip 1c and the anode electrode film 21 of the diode DI (DI8) of the second RC-IGBT chip 1d are electrically connected by a wire 52a. The anode electrode film 21 of the diode DI (DI7) of the first RC-IGBT chip 1c and the emitter electrode film 17 of the IGBT (TR6) of the second RC-IGBT chip 1d are electrically connected by a wire 52b. Although not illustrated in the FIG. 23, the IGBT (TR6), the IGBT (TR8), the diode DI9, and the diode DI10 are also provided in the semiconductor device SED.

Figure 24:
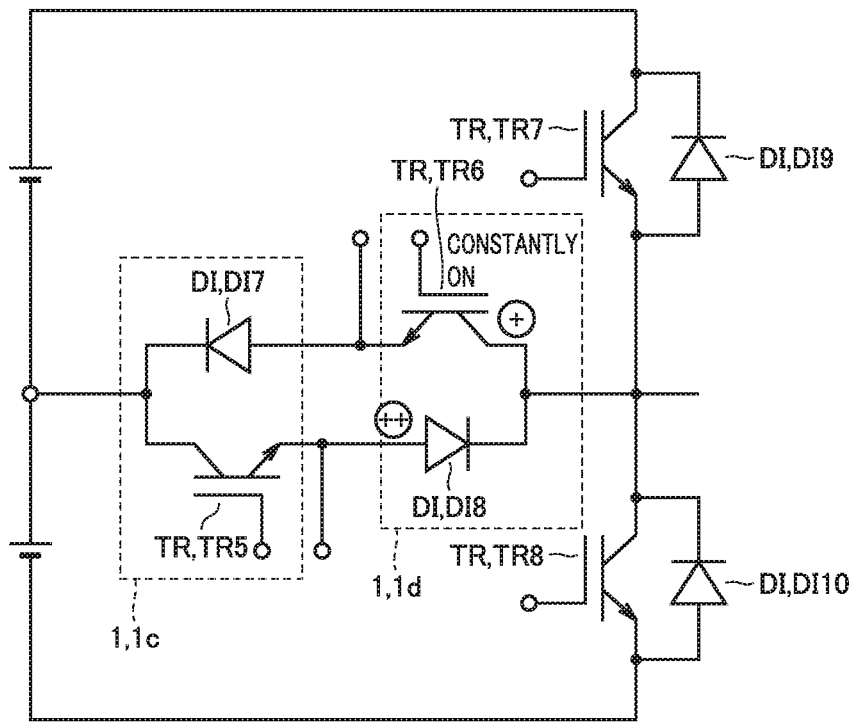
FIG. 24 is a first diagram for explaining the operation of an inverter circuit according to the ninth embodiment.

Similar to the neutral point clamp circuit, in the neutral point switching type 3-level inverter circuit, when the IGBT (TR) is turned on while a forward current is flowing through the diode DI in the RC-IGBT chip 1, a channel is formed. An example of this state is illustrated in FIG. 24. FIG. 24 illustrates that when the IGBT (TR5) is turned on, for example, during a period in which the IGBT (TR6) is kept ON constantly and a forward current is flowing through the diode DI7, a channel is formed.

Figure 25:
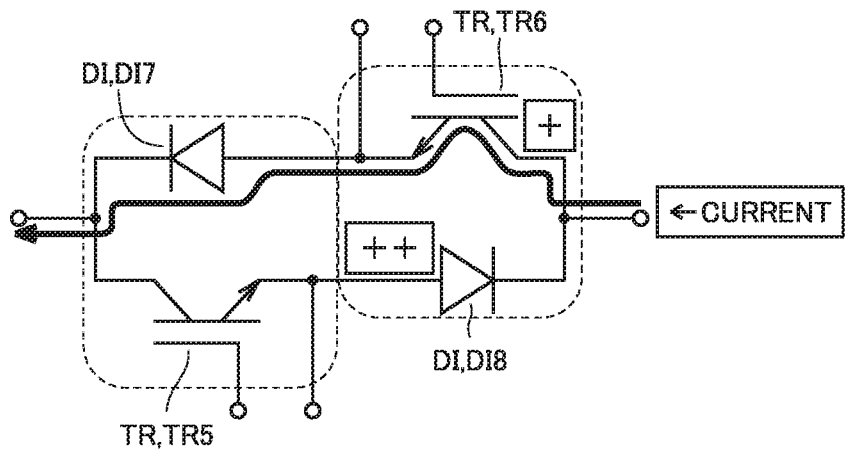
FIG. 25 is a second diagram for explaining the operation of the inverter circuit according to the ninth embodiment.

As illustrated in FIG. 25, in this state, the current in the 3-level inverter circuit flows through the IGBT (TR6) and the diode DI7 sequentially as illustrated by the thick solid line. At this time, the potential on the anode side of the diode DI8 electrically connected to the IGBT (TR6) increases by an amount (represented by symbol +) corresponding to the on-voltage (VCEsat) of the IGBT (TR6).

Since no current flows through the diode DI8, it is in a floating state. Thus, a potential difference occurs between the cathode and the anode of the diode DI8 due to an electric field in the depletion layer or the like, and the potential (represented by symbol ++) on the anode side of the diode DI8 becomes higher than the potential (represented by symbol +) on the cathode side of the diode DI8.

Thereby, it is possible to prevent the holes injected into the diode DI7 from flowing into the channel of the IGBT (TR5) that is turned on. As a result, an increase in the on-voltage of the first diode element may be suppressed.

In addition, the length of the boundary between the transistor region IR and the diode region DR as illustrated in FIG. 23 may suppress an increase in the on-state voltage of the diode DI without affecting the on-state voltage while maintaining the heat radiation effect.

Tenth Embodiment

A semiconductor device according to a tenth embodiment will be described.

Figure 26:
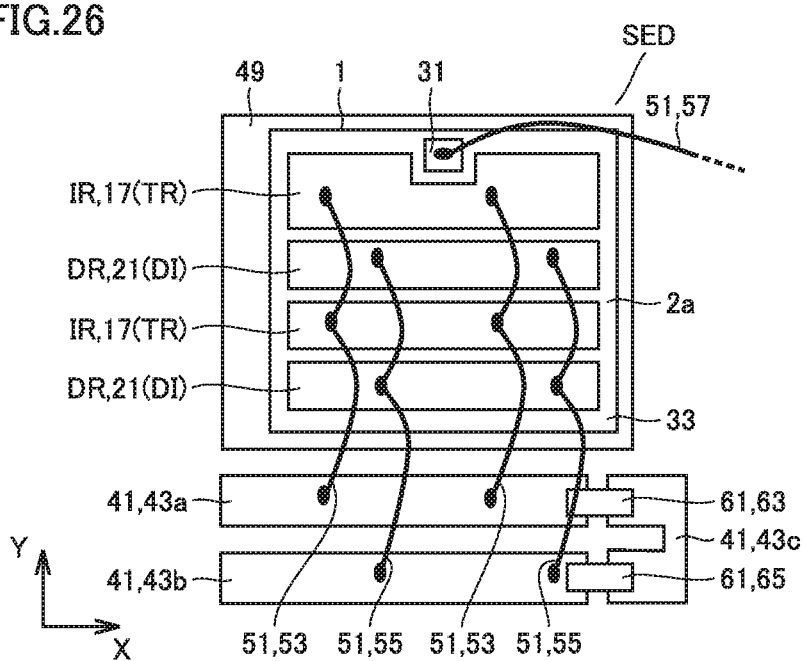
FIG. 26 is a plan view illustrating a planar structure of a semiconductor device according to a tenth embodiment.

As illustrated in FIG. 26, a transistor region IR and a diode region DR are defined on the first main surface 2a of the semiconductor substrate 2 in the RC-IGBT chip 1 of the semiconductor device SED. A first-external-wiring first portion 43a, a first-external-wiring second portion 43b, a joining portion 43c, and sense resistors 63 and 65 are arranged at one side of the RC-IGBT chip 1 as the wiring conductor. The sense resistor 63 is interposed between the first-external-wiring first portion 43a and the joining portion 43c. The sense resistor 65 is interposed between the first-external-wiring second portion 43b and the joining portion 43c.

Since the other configurations are the same as those of the semiconductor device SED illustrated in FIG. 19, the same members are denoted by the same reference numerals, and the description thereof will not be repeated unless necessary.

In the semiconductor device SED described above, the wire 53 that electrically connects the IGBTs (TR) to each other is connected to the first-external-wiring first portion 43a, and the wire 55 that electrically connects the diodes DI to each other is connected to the first-external-wiring second portion 43b. The first-external-wiring first portion 43a and the first-external-wiring second portion 43b are joined together by the sense resistors 63 and 65 as the sense resistor 61 in addition to the joining portion 43c.

Thus, compared with the case where the first external wiring 43 is disposed, it is possible to apply a potential much higher than the potential of the anode electrode film 21 to the emitter electrode film 17 of the IGBT (TR) which makes it possible to suppress an increase in the on-voltage of the diode DI more effectively.

Eleventh Embodiment

A semiconductor device according to an eleventh embodiment will be described. In the present embodiment, a first example of a semiconductor device which includes an emitter electrode film and an anode electrode film that are integrated and is characterized in wire connection will be described. The IGBT (TR) corresponds to a switching element, and the diode DI corresponds to a diode element.

Figure 27:
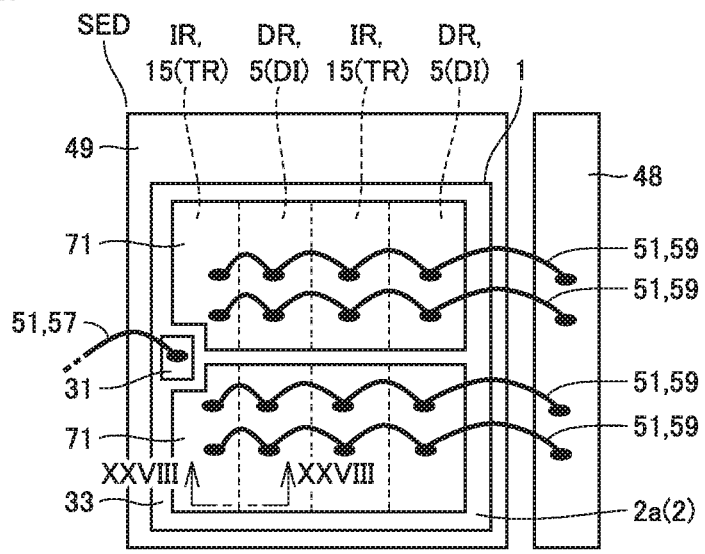
FIG. 27 is a plan view illustrating a planar structure of a semiconductor device according to an eleventh embodiment.
Figure 28:
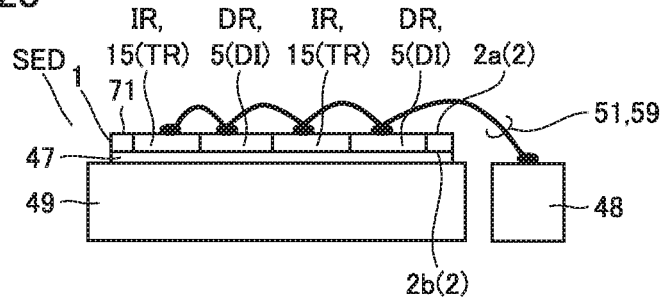
FIG. 28 is a side view including a cross section taken along a section line XXVIII-XXVIII illustrated in FIG. 27 according to the eleventh embodiment.
Figure 29:
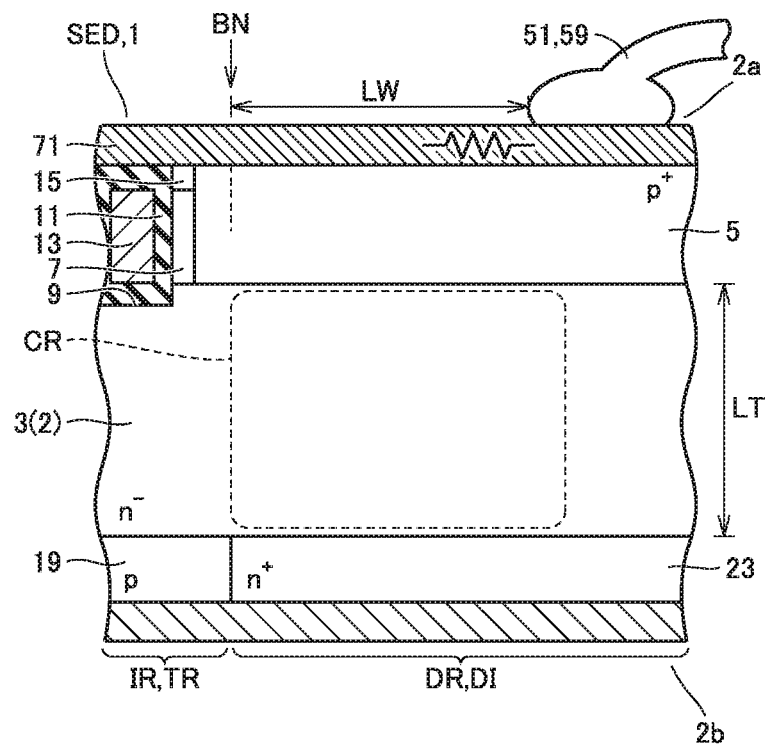
FIG. 29 is a cross-sectional view illustrating a part in the vicinity of a boundary between an IGBT region and a diode region according to the eleventh embodiment.

As illustrated in FIGS. 27, 28 and 29, a transistor region IR and a diode region DR are defined on the first main surface 2a of the semiconductor substrate 2 in the RC-IGBT chip 1 of the semiconductor device SED. An IGBT (TR) is formed in the transistor region IR. A diode DI is formed in the diode region DR. An emitter/anode electrode film 71 is formed in contact with both the emitter layer 15 and the anode layer 5.

A wire 59 is connected to the emitter/anode electrode film 71 so as to bridge a portion where the transistor region IR is disposed and a portion where the diode region DR is disposed. The wire 59 is connected to a conductor member 48. The wire 59 is connected to the emitter/anode electrode film 71 at a position spaced from the boundary BN between the transistor region IR and the diode region DR by a distance.

Specifically, as illustrated in FIG. 29, the position at which the wire 59 is connected to a portion of the emitter/anode electrode film 71 where the diode region DR is disposed is spaced from the boundary BN between the transistor region IR and the diode region DR by a distance LW. If the thickness of the n− layer 3 serving as the intrinsic semiconductor layer in the diode DI is denoted by LT, the distance LW is set greater than the thickness LT.

The second main surface 2b of the RC-IGBT chip 1 is bonded to the conductor plate 49 by solder 47. The other configurations are the same as those of the semiconductor device SED illustrated in FIGS. 5 and 6 or the like, the same members are denoted by the same reference numerals, and the description thereof will not be repeated unless necessary.

In the semiconductor device SED described above, the emitter/anode electrode film 71 is arranged in contact with both the emitter layer 15 and the anode layer 5. For example, an aluminum film is applied as the emitter/anode electrode film 71. Aluminum is one of the materials which allow a current to flow through easily. Since the aluminum film applied to the semiconductor device SED is relatively thin, when a large current flows through the aluminum film, an resistance is generated in the surface direction of the aluminum film.

In the diode region DR, the wire 59 is connected to the emitter/anode electrode film 71 at a position spaced from the boundary BN between the transistor region IR and the diode region DR by a distance LW greater than the thickness LT of the n− layer 3.

Thus, when a forward current flows through the diode DI, because of the resistance in the surface direction of the emitter/anode electrode film 71, the number of carriers injected into a region CR in the n− layer 3 located between the position where the wire 59 is connected and the boundary BN is smaller than the number of carriers injected into the portion of the n− layer 3 immediately below the wire 59.

Therefore, even when the IGBT (TR) is turned on during the period in which the forward current is flowing through the diode DI, and thereby a channel is formed in the IGBT (TR), it is possible to reduce the amount of carriers flowing into the channel, which makes it possible to suppress an increase in the on-voltage of the diode DI. In addition, it is also possible to ensure the heat radiation effect by the emitter/anode electrode film 71 in contact with both the emitter layer 15 and the anode layer 5.

Twelfth Embodiment

A semiconductor device according to a twelfth embodiment will be described. In the present embodiment, an example in which the wire connection is modified will be described. An IGBT (TR) corresponds to a switching-element first portion and a switching-element second portion. A diode DI corresponds to a diode-element first portion and a diode-element second portion.

Figure 30:
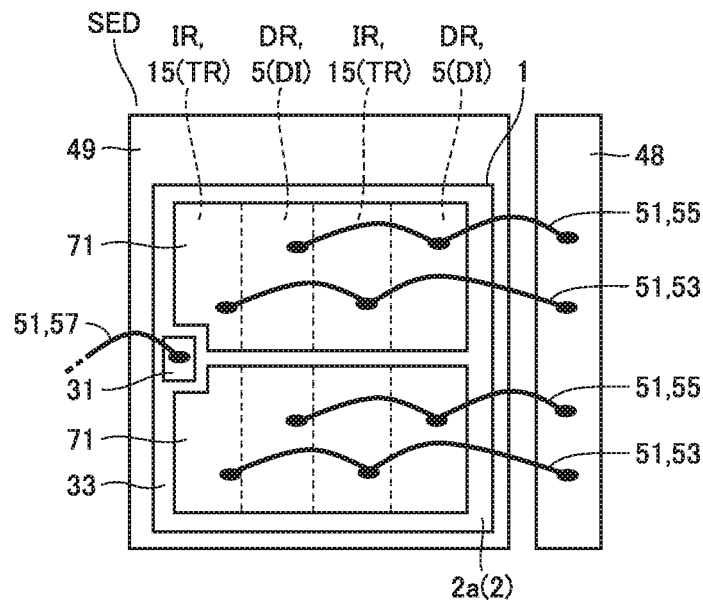
FIG. 30 is a plan view illustrating a planar structure of a semiconductor device according to a twelfth embodiment.
Figure 31:
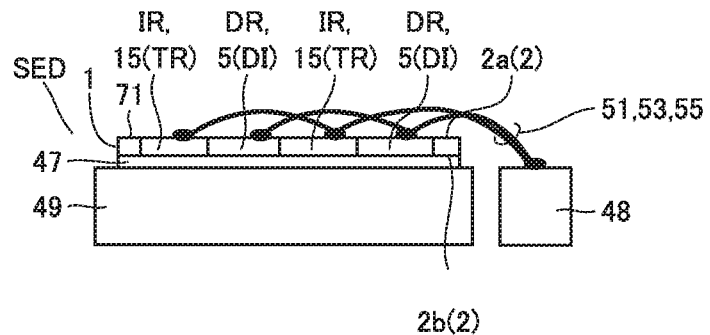
FIG. 31 is a side view of the semiconductor device illustrated in FIG. 30 according to the twelfth embodiment.

As illustrated in FIGS. 30 and 31, a transistor region IR and a diode region DR are defamed on the first main surface 2a of the semiconductor substrate 2 in the RC-IGBT chip 1 of the semiconductor device SED. An IGBT (TR) is formed in the transistor region IR. A diode DI is formed in the diode region DR. An emitter/anode electrode film 71 is formed in contact with both the emitter layer 15 and the anode layer 5.

In the emitter/anode electrode film 71, a portion where one transistor region IR is disposed and a portion where another transistor region IR is disposed are connected by a wire 53. The wire 53 is connected to a conductor member 48.

In the emitter/anode electrode film 71, a portion where one diode region DR is disposed and a portion where another diode region DR is disposed are connected by a wire 55. In the diode region DR, the wire 55 is connected to the emitter/anode electrode film 71 at a position spaced from the boundary BN between the transistor region IR and the diode region DR by a distance LW greater than the thickness LT of the n− layer 3 (See FIG. 29).

Since the other configurations are the same as those of the semiconductor device illustrated in FIGS. 27 and 28, the same members are denoted by the same reference numerals, and the description thereof will not be repeated unless necessary.

In the semiconductor device SED described above, the IGBT (TR) and the diode DI adjacent to each other are not directly connected to each other by a wire, but are electrically connected to each other through the wire 53, the conductor member 48 and the wire 55. As a result, compared to the semiconductor device SED described in the eleventh embodiment, the potential on the emitter side of the IGBT (TR) is slightly increased due to the potential difference caused by the impedance of the wire 55.

Thus, when the IGBT (TR) is turned on during a period in which a forward current is flowing through the diode DI, and thereby a channel is formed in the IGBT (TR), it is possible to further reduce the amount of carriers flowing from the n− layer 3 into the channel, which makes it possible to effectively suppress an increase in the on-voltage of the diode DI.

Thirteenth Embodiment

A semiconductor device according to a thirteenth embodiment will be described. In the present embodiment, another example in which the wire connection is modified will be described. The IGBT (TR) corresponds to a switching-element third portion and a switching-element fourth portion. The diode DI corresponds to a diode-element third portion and a diode-element fourth portion.

Figure 32:
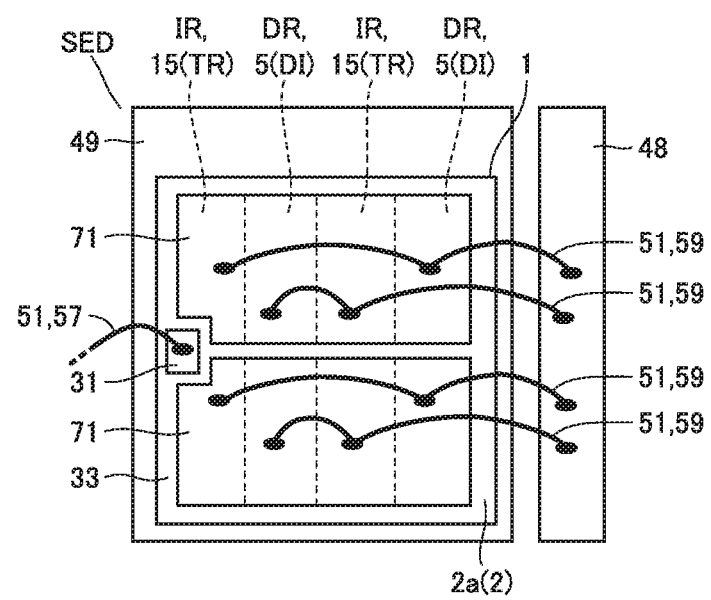
FIG. 32 is a plan view illustrating a planar structure of a semiconductor device according to a thirteenth embodiment.
Figure 33:
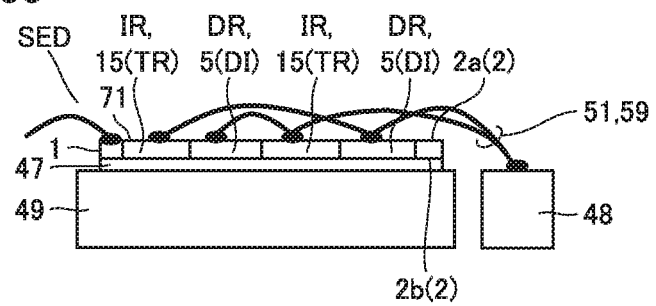
FIG. 33 is a side view of the semiconductor device illustrated in FIG. 32 according to the thirteenth embodiment.

As illustrated in FIGS. 32 and 33, a transistor region IR and a diode region DR are defined on the first main surface 2a of the semiconductor substrate 2 in the RC-IGBT chip 1 of the semiconductor device SED. An IGBT (TR) is formed in the transistor region IR. A diode DI is formed in the diode region DR. An emitter/anode electrode film 71 is formed in contact with both the emitter layer 15 and the anode layer 5.

In the emitter/anode electrode film 71, a portion where one transistor region IR is disposed and a portion where one diode region DR is disposed are connected by a wire 59. The wire 59 is connected to a conductor member 48.

In the emitter/anode electrode film 71, a portion where the other diode region DR is disposed and a portion where the other transistor region IR is disposed are connected by a wire 59. The wire 59 is connected to the conductor member 48.

In the diode region DR, the wire 59 is connected to the emitter/anode electrode film 71 at a position spaced from the boundary BN between the transistor region IR and the diode region DR by a distance LW greater than the thickness LT of the n− layer 3 (See FIG. 29).

Since the other configurations are the same as those of the semiconductor device illustrated in FIGS. 27 and 28, the same members are denoted by the same reference numerals, and the description thereof will not be repeated unless necessary.

According to the semiconductor device SED described above, the following effect may be obtained in addition to the effects described in the eleventh embodiment. The wire 59 is connected to a portion of the emitter/anode electrode film 71 where one transistor region IR is disposed and a portion thereof where one diode region DR is disposed, and is also connected to the conductor member 48.

Further, the wire 59 is connected to a portion of the emitter/anode electrode film 71 where the other diode region DR is disposed and a portion thereof where the other transistor region IR is disposed, and is also connected to the conductor member 48.

Thus, no current flows through the IGBT (TR) and the diode DI at the same time. Therefore, only a current from one IGBT (TR) or from one diode DI flows in each wire 59. Thereby, compared with the case where a current from two IGBTs (TRs) flows through one wire, for example, the current is well balanced.

Fourteenth Embodiment

A semiconductor device according to a fourteenth embodiment will be described. In the present embodiment, a semiconductor device which allows a wire to be connected to a desired position in an emitter/anode electrode film will be described.

Figure 34:
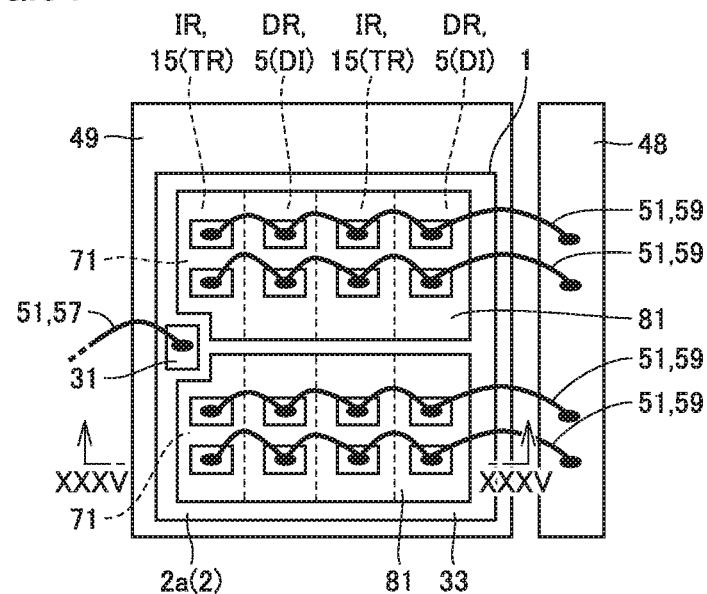
FIG. 34 is a plan view illustrating a planar structure of a semiconductor device according to a fourteenth embodiment.
Figure 35:
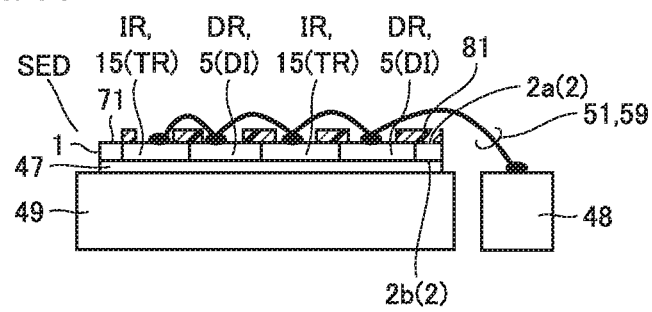
FIG. 35 is a side view of the semiconductor device illustrated in FIG. 34 according to the fourteenth embodiment.

As illustrated in FIGS. 34 and 35, for example, a polyimide film 81 is formed on the first main surface 2a of the semiconductor substrate 2 in the RC-IGBT chip 1 of the semiconductor device SED. The polyimide film 81 is formed with an opening for exposing the emitter/anode electrode film 71 at a position to which the wire 51 is to be connected.

Since the other configurations are the same as those of the semiconductor device illustrated in FIGS. 27 and 28, the same members are denoted by the same reference numerals, and the description thereof will not be repeated unless necessary.

In the semiconductor device SED described above, the polyimide film 81 is formed so as to cover the emitter/anode electrode film 71. The polyimide film 81 is formed with an opening for exposing the emitter/anode electrode film 71. The opening is formed at a position to which the wire 51 is to be connected. Thereby, it is possible to ensure that the wire 51 is connected to the position (see FIG. 29) spaced by a distance LW from the boundary BN between the transistor region IR and the diode region DR (see FIG. 29).

Note that the semiconductor devices described in the embodiments may be combined as necessary.

It should be understood that the embodiments disclosed herein have been presented for the purpose of illustration and description but not limited in all aspects. It is intended that the scope of the present disclosure is not limited to the description above but defined by the scope of the claims and encompasses all modifications equivalent in meaning and scope to the claims.

The semiconductor device according to the present disclosure may be effectively used as a power semiconductor device.

What is claimed is:

1. A semiconductor device comprising:
    a semiconductor chip unit including a first semiconductor chip which has a first main surface and a second main surface facing each other, a first switching element being formed in a first element region defined on the first main surface, and a first diode element being formed in a second element region defined on the first main surface,
    the first switching element including:
        a first emitter layer formed on the side of the first main surface;
        a first collector layer formed on the side of the second main surface;
        a first gate electrode formed on the side of the first main surface; and
        a first electrode film formed in contact with the first emitter layer,
    the first diode element including:
        a first anode layer formed on the side of the first main surface;
        a first cathode layer formed on the side of the second main surface; and
        a second electrode film formed in contact with the first anode layer,
    the first electrode film in the first switching element and the second electrode film in the first diode element being separated from each other by a distance,
    the semiconductor device further comprising a wiring conductor which includes a portion that electrically connects the first electrode film and the second electrode film and has an impedance,
    the wiring conductor having a first impedance with the first electrode film and having a second impedance with the second electrode film, the first impedance being smaller than the second impedance.

2. The semiconductor device according to claim 1, wherein
    the first electrode film and the second electrode film are formed in such a manner that a portion located between the first electrode film and the second electrode film separated from each other by the distance has a curved pattern.

3. The semiconductor device according to claim 1, further comprising a guard ring region formed along an outer periphery of the first semiconductor chip so as to surround the first element region and the second element region, wherein the guard ring region includes a first outer peripheral portion and a second outer peripheral portion both extending in a first direction and facing each other with a distance therebetween in a second direction intersecting the first direction, the first element region includes a first-element-region first portion and a first-element-region second portion, the first-element-region first portion is formed with a first-switching-element first portion as the first switching element, the first-element-region second portion is formed with a first-switching-element second portion as the first switching element, the first-switching-element first portion includes a first-electrode-film first portion as the first electrode film, the first-switching-element second portion includes a first-electrode-film second portion as the first electrode film, the first-electrode-film first portion is disposed to face the first outer peripheral portion along the first direction, the first-electrode-film second portion is disposed to face the second outer peripheral portion along the first direction, and the second electrode film is disposed between the first-electrode-film first portion and the first-electrode-film second portion.

4. The semiconductor device according to claim 3, wherein when the length of the first outer peripheral portion in the first direction is set as a first length and the length of the first-electrode-film first portion in the first direction is set as a second length, the second length is equal to or greater than ⅔ of the first length.

5. The semiconductor device according to claim 1, further comprising a guard ring region formed along an outer periphery of the first semiconductor chip so as to surround the first element region and the second element region, wherein the guard ring region includes a first outer peripheral portion and a second outer peripheral portion both extending in a first direction and facing each other with a distance therebetween in a second direction intersecting the first direction, the second element region includes a second-element-region first portion and a second-element-region second portion, the second-element-region first portion is formed with a first-diode-element first portion as the first diode element, the second-element-region second portion is formed with a first-diode-element second portion as the first diode element, the first-diode-element first portion includes a second-electrode-film first portion as the second electrode film, the first-diode-element second portion includes a second-electrode-film second portion as the second electrode film, the second-electrode-film first portion is disposed to face the first outer peripheral portion along the first direction, the second-electrode-film second portion is disposed to face the second outer peripheral portion along the first direction, and the first electrode film is disposed between the second-electrode-film first portion and the second-electrode-film second portion.

6. The semiconductor device according to claim 1, further comprising a guard ring region formed along an outer periphery of the first semiconductor chip so as to surround the first element region and the second element region, wherein all sides of the second electrode film do not face the guard ring region, and the first electrode film faces the guard ring region.

7. The semiconductor device according to claim 1, further comprising a guard ring region formed along an outer periphery of the first semiconductor chip so as to surround the first element region and the second element region, wherein the first element region includes a first-element-region third portion and a first-element-region fourth portion, the first-element-region third portion is formed with a first-switching-element third portion as the first switching element, the first-element-region fourth portion is formed with a first-switching-element fourth portion as the first switching element, the first-switching-element third portion includes a first-electrode-film third portion as the first electrode film, the first-switching-element fourth portion includes a first-electrode-film fourth portion as the first electrode film, when the length of a portion of the first-electrode-film third portion facing the guard ring region is set as a first length and the length of a portion of the first-electrode-film fourth portion facing the guard ring region is set as a second length, the first length is longer than the second length, and an area of the first-electrode-film third portion is set to be larger than an area of the first-electrode-film fourth portion.

8. The semiconductor device according to claim 1, further comprising a guard ring region formed along an outer periphery of the first semiconductor chip so as to surround the first element region and the second element region, wherein the second element region includes a second-element-region third portion and a second-element-region fourth portion, the second-element-region third portion is formed with a first-diode-element third portion as the first diode element, the second-element-region fourth portion is formed with a first-diode-element fourth portion as the first diode element, the first-diode-element third portion includes a second-electrode-film third portion as the second electrode film, the first-diode-element fourth portion includes a second-electrode-film fourth portion as the second electrode film, when the length of a portion of the second-electrode-film third portion facing the guard ring region is set as a third length and the length of a portion of the second-electrode-film fourth portion facing the guard ring region is set as a fourth length, the third length is longer than the fourth length, and an area of the second-electrode-film third portion is set to be larger than an area of the second-electrode-film fourth portion.

9. The semiconductor device according to claim 1, wherein
the first element region includes a first-element-region fifth portion and a first-element-region sixth portion,
the first-element-region fifth portion is formed with a first-switching-element fifth portion as the first switching element,
the first-element-region sixth portion is formed with a first-switching-element sixth portion as the first switching element,
the first-switching-element fifth portion includes a first-electrode-film fifth portion as the first electrode film,
the first-switching-element sixth portion includes a first-electrode-film sixth portion as the first electrode film,
the second element region includes a second-element-region fifth portion and a second-element-region sixth portion,
the second-element-region fifth portion is formed with a first-diode-element fifth portion as the first diode element,
the second-element-region sixth portion is formed with a first-diode-element sixth portion as the first diode element,
the first-diode-element fifth portion includes a second-electrode-film fifth portion as the second electrode film,
the first-diode-element sixth portion includes a second-electrode-film sixth portion as the second electrode film,
the first-electrode-film fifth portion, the first-electrode-film sixth portion, the second-electrode-film fifth portion and the second-electrode-film sixth portion all extend in a first direction, and are arranged along a second direction intersecting the first direction,
the wiring conductor includes:
a first external wiring;
a first wire that electrically connects the first-electrode-film fifth portion and the first-electrode-film sixth portion to the first external wiring along the second direction; and
a second wire that electrically connects the second-electrode-film fifth portion and the second-electrode-film sixth portion to the first external wiring along the second direction.

10. The semiconductor device according to claim 9, wherein
the first external wiring includes:
a first-external-wiring first portion;
a first-external-wiring second portion; and
a joining portion that joins a first-external-wiring first portion and the first-external-wiring second portion,
the first wire is connected to the first-external-wiring first portion, and
the second wire is connected to the first-external-wiring second portion.

11. The semiconductor device according to claim 10, wherein
a sense resistor is connected between the first-external-wiring first portion and the first-external-wiring second portion.

12. The semiconductor device according to claim 1, wherein
the semiconductor chip unit includes a second semiconductor chip which has a third main surface and a fourth main surface facing each other, wherein a second switching element is formed in a third element region defined on the third main surface, and a second diode element is formed in a fourth element region defined on the third main surface,
the second switching element including:
a second emitter layer formed on the side of the third main surface;
a second collector layer formed on the side of the fourth main surface;
a second gate electrode formed on the side of the third main surface; and
a third electrode film formed in contact with the second emitter layer,
the second diode element including:
a second anode layer formed on the side of the third main surface;
a second cathode layer formed on the side of the fourth main surface; and
a fourth electrode film formed in contact with the second anode layer,
the third electrode film in the second switching element and the fourth electrode film in the second diode element being separated from each other by a distance,
the first collector layer, the first cathode layer, the second collector layer, and the second cathode layer are electrically connected,
the wiring conductor includes a third wire, a fourth wire, and a second external wiring,
the third wire electrically connects the first electrode film of the first switching element and the fourth electrode film of the second diode element to the second external wiring, and
the fourth wire electrically connects the second electrode film of the first diode element and the third electrode film of the second switching element to the second external wiring.

13. A semiconductor device comprising:
a semiconductor chip unit including a first semiconductor chip which has a first main surface and a second main surface facing each other, a first switching element being formed in a first element region defined on the first main surface, and a first diode element being formed in a second element region defined on the first main surface; and
a second semiconductor chip which has a third main surface and a fourth main surface facing each other, wherein a second switching element is formed in a third element region defined on the third main surface, and a second diode element is formed in a fourth element region defined on the third main surface,
the first switching element including:
a first emitter layer formed on the side of the first main surface;
a first collector layer formed on the side of the second main surface;
a first gate electrode formed on the side of the first main surface; and
a first electrode film formed in contact with the first emitter layer,
the first diode element including:
a first anode layer formed on the side of the first main surface;
a first cathode layer formed on the side of the second main surface; and
a second electrode film formed in contact with the first anode layer,
the second switching element including:

a second emitter layer formed on the side of the third main surface;
a second collector layer formed on the side of the fourth main surface;
a second gate electrode formed on the side of the third main surface; and
a third electrode film formed in contact with the second emitter layer,
the second diode element including:
a second anode layer formed on the side of the third main surface;
a second cathode layer formed on the side of the fourth main surface; and
a fourth electrode film formed in contact with the second anode layer,
the first electrode film in the first switching element and the second electrode film in the first diode element being separated from each other by a distance,
the third electrode film in the second switching element and the fourth electrode film in the second diode element being separated from each other by a distance,
the first collector layer and the first cathode layer being electrically connected,
the second collector layer and the second cathode layer being electrically connected,
the semiconductor device further comprising a wiring conductor which includes a first wire that electrically connects the first electrode film of the first switching element and the fourth electrode film of the second diode element and a second wire that electrically connects the second electrode film of the first diode element and the third electrode film of the second switching element.

14. A semiconductor device comprising:
a semiconductor chip which has a first main surface and a second main surface facing each other, a switching element being formed in a first element region defined on the first main surface, and a diode element being formed in a second element region defined on the first main surface,
the switching element including:
an emitter layer formed on the side of the first main surface;
a collector layer formed on the side of the second main surface; and
a gate electrode formed on the side of the first main surface,
the diode element including:
an anode layer formed on the side of the first main surface; and
a cathode layer formed on the side of the second main surface,
the semiconductor device further comprising:
an electrode film formed directly on the first main surface and extending from the emitter layer to the anode layer and in direct contact with the emitter layer and the anode layer and arranged to cover the first main surface; and
a wiring conductor electrically connected to the electrode film,
the wiring conductor being connected to a position spaced by a distance from a portion of the electrode film located immediately above a boundary between the first element region and the second element region.

15. The semiconductor device according to claim 14, wherein
the semiconductor chip includes a semiconductor layer of a first conductivity type that is formed between the anode layer and the cathode layer and has a first thickness,
the wiring conductor is connected to a position spaced by a distance longer than the first thickness as the distance from the portion of the electrode film located immediately above the boundary.

16. The semiconductor device according to claim 14, wherein
the first element region includes a first-element-region first portion and a first-element-region second portion,
the first-element-region first portion is formed with a switching-element first portion as the switching element,
the first-element-region second portion is formed with a switching-element second portion as the switching element,
the second element region includes a second-element-region first portion and a second-element-region second portion,
the second-element-region first portion is formed with a diode-element first portion as the diode element,
the second-element-region second portion is formed with a diode-element second portion as the diode element,
the first-element-region first portion and the first-element-region second portion are arranged with a distance therebetween,
the second-element-region first portion and the second-element-region second portion are arranged with a distance therebetween,
the wiring conductor includes:
a first wire that electrically connects a first portion of the electrode film located immediately above the first-element-region first portion and a second portion of the electrode film located immediately above the first-element-region second portion;
a second wire that electrically connects a third portion of the electrode film located immediately above the second-element-region first portion and a fourth portion of the electrode film located immediately above the second-element-region second portion; and
a first external wiring that electrically connects the first wire and the second wire.

17. The semiconductor device according to claim 14, wherein
the first element region includes a first-element-region third portion and a first-element-region fourth portion,
the first-element-region third portion is formed with a switching-element third portion as the switching element,
the first-element-region fourth portion is formed with a switching-element fourth portion as the switching element,
the second element region includes a second-element-region third portion and a second-element-region fourth portion,
the second-element-region third portion is formed with a diode-element third portion as the diode element,
the second-element-region fourth portion is formed with a diode-element fourth portion as the diode element,
the first-element-region third portion and the first-element-region fourth portion are arranged with a distance therebetween,
the second-element-region third portion and the second-element-region fourth portion are arranged with a distance therebetween, the wiring conductor includes:
- a third wire that electrically connects a fifth portion of the electrode film located immediately above the first-element-region third portion and a sixth portion of the electrode film located immediately above the second-element-region third portion;
- a fourth wire that electrically connects a seventh portion of the electrode film located immediately above the first-element-region fourth portion and an eighth portion of the electrode film located immediately above the second-element-region fourth portion; and
- a second external wiring that electrically connects the third wire and the fourth wire.

18. The semiconductor device according to claim 14, wherein
- a protective film is formed to cover the first main surface, and
- the protective film is formed with an opening at a position to which the wiring conductor is connected.

\* \* \* \* \*